United States Patent
Hung et al.

(10) Patent No.: US 8,878,312 B2
(45) Date of Patent: Nov. 4, 2014

(54) ELECTRICAL BYPASS STRUCTURE FOR MEMS DEVICE

(75) Inventors: Chia-Ming Hung, Taipei (TW); Hung-Sen Wang, Guantian Shiang (TW); Hsiang-Fu Chen, Jhudong Township, Hsinchu County (TW); Te-Hsi Lee, Taipei (TW); Alex Kalnitsky, San Francisco, CA (US); Wen-Chuan Tai, Dayuan Township, Taoyuan County (TW); Kuei-Sung Chang, Kaohsiung (TW); Yi Heng Tsai, Hsinchu (TW)

(73) Assignee: Taiwan Semiconductor manufacturing Company, Ltd., Hsin-Chu (TW)

( * ) Notice: Subject to any disclaimer, the term of this patent is extended or adjusted under 35 U.S.C. 154(b) by 164 days.

(21) Appl. No.: 13/195,243

(22) Filed: Aug. 1, 2011

(65) Prior Publication Data
US 2012/0223613 A1    Sep. 6, 2012

Related U.S. Application Data

(60) Provisional application No. 61/447,907, filed on Mar. 1, 2011.

(51) Int. Cl.
*H01L 29/84* (2006.01)
*B81C 1/00* (2006.01)

(52) U.S. Cl.
CPC ....... *B81C 1/00579* (2013.01); *B81B 2207/015* (2013.01); *B81C 2203/0771* (2013.01)
USPC ............. 257/415; 257/E23.011; 257/E29.324

(58) Field of Classification Search
USPC ............................................ 310/300; 29/830
See application file for complete search history.

(56) References Cited

U.S. PATENT DOCUMENTS

| | | | |
|---|---|---|---|
| 8,227,285 B1* | 7/2012 | Yang | 438/50 |
| 2004/0262645 A1* | 12/2004 | Huff et al. | 257/232 |
| 2007/0001240 A1* | 1/2007 | Mallikarjunaswamy et al. | 257/409 |
| 2011/0037160 A1* | 2/2011 | Hsu et al. | 257/690 |
| 2011/0127620 A1* | 6/2011 | Wang et al. | 257/415 |

OTHER PUBLICATIONS

Ann Witvouw, "CMOS-MEMS Integration: Why, How and What?", ICCAS '06, Nov. 5-9, 2006, San Jose, CA, pp. 826-827.

* cited by examiner

*Primary Examiner* — William F Kraig
*Assistant Examiner* — Khaja Ahmad
(74) *Attorney, Agent, or Firm* — Haynes and Boone, LLP

(57) ABSTRACT

An apparatus including a bypass structure for complementary metal-oxide-semiconductor (CMOS) and/or microelectromechanical system (MEMS) devices, and method for fabricating such apparatus, is disclosed. An exemplary apparatus includes a first substrate; a second substrate that includes a MEMS device; an insulator disposed between the first substrate and the second substrate; and an electrical bypass structure disposed in the insulator layer that contacts a portion of the first substrate, wherein the electrical bypass structure is electrically isolated from the MEMS device in the second substrate and any device included in the first substrate.

15 Claims, 26 Drawing Sheets

FIG. 26

ELECTRICAL BYPASS STRUCTURE FOR MEMS DEVICE

This application claims priority to Provisional U.S. Patent Application Ser. No. 61/447,907, filed on Mar. 1, 2011, the entire disclosure of which is incorporated herein by reference.

BACKGROUND

Microelectromechanical systems (MEMS) devices are electro-mechanical systems incorporated into integrated circuit devices, such as integrated circuit devices fabricated using complementary metal-oxide-semiconductor (CMOS) fabrication technologies (referred to as CMOS devices). CMOS-MEMS integration (also referred to as monolithic integration) can improve device performance, allows for smaller packaging, and reduces manufacturing costs. In CMOS-MEMS integration, integrating MEMS devices into the CMOS processes can be done by (1) processing the MEMS device first and the integrated circuit device last, (2) mixing the processing of the MEMS and integrated circuit devices, or (3) processing the integrated circuit device first and the MEMS device last. When the MEMS device is processed last, the MEMS device is typically formed by etching a MEMS device layer disposed over the integrated circuit device. Charge accumulation during the etching process can damage the integrated circuit device, since typically, the MEMS device layer has been interconnected to the integrated circuit device before etching. Accordingly, although existing approaches for CMOS-MEMS integration have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
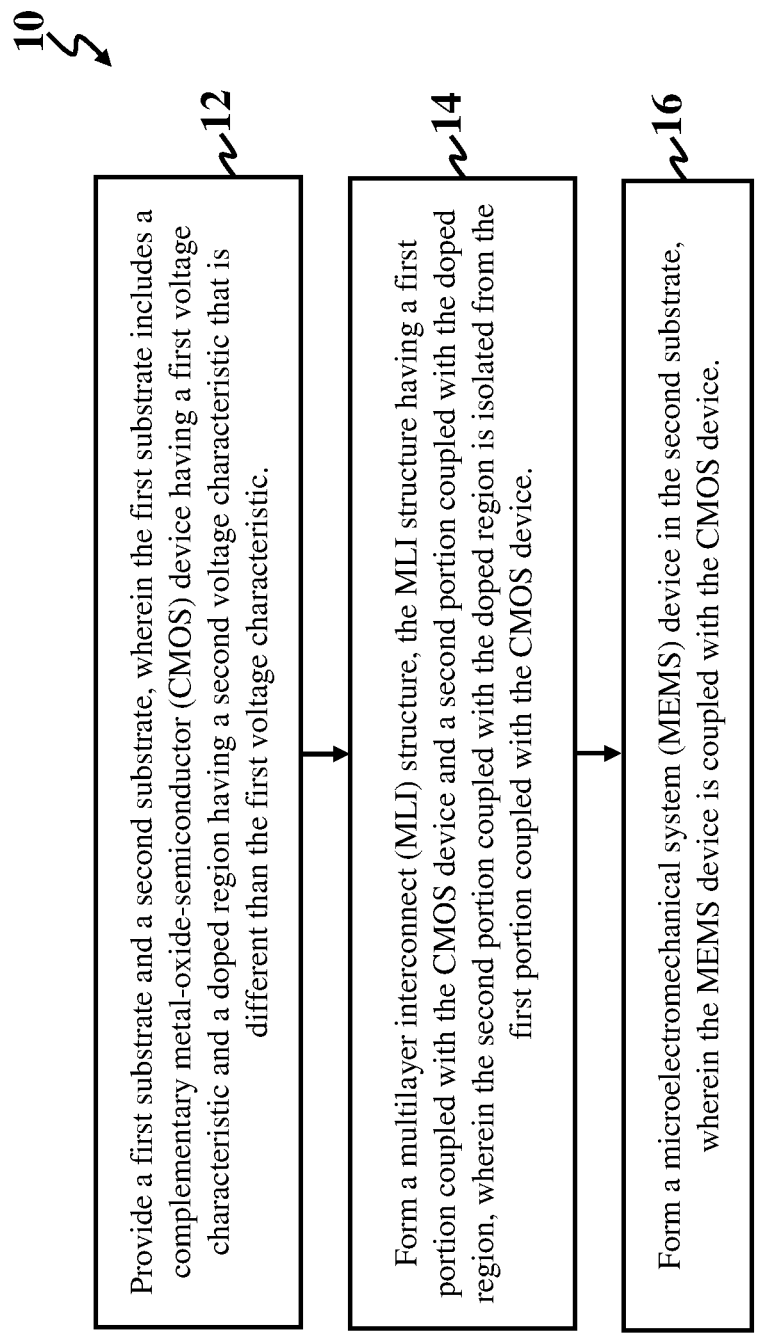
FIG. 1 is a flow chart of a method for fabricating a device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, descriptions of a first feature "on" or "over" a second feature (and like descriptions) may include embodiments where the first and second features are in direct contact, and may also include embodiments where additional features are interposed between the first and second features. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a flow chart of a method 10 for fabricating a device according to various aspects of the present disclosure. The method 10 fabricates a complementary metal-oxide-semiconductor (CMOS) device integrated with a microelectromechanical systems (MEMS) device. At block 12, a first substrate and a second substrate are provided. In an example, the first substrate is bonded to the second substrate. The first substrate includes a CMOS device and a doped region. The CMOS device has a first voltage characteristic, and the doped region has a second voltage characteristic that is different than the first voltage characteristic. For example, the CMOS device has a breakdown voltage that is greater than a pass through voltage of the doped region. At block 14, a multilayer interconnect (MLI) structure is formed, specifically over the CMOS device and the doped region. The MLI structure has a first portion coupled with the CMOS device and a second portion coupled with the doped region. The second portion coupled with the doped region is isolated from the first portion coupled with the CMOS device. The first substrate and/or the second substrate may include a portion of the MLI structure, and/or the first substrate and/or the second substrate may be coupled with the MLI structure. In an example, a conductive feature is formed over the MLI structure, such that the first portion and the second portions of the MLI structure are connected to one another. At block 16, a MEMS device is formed in the second substrate. For example, a plasma etching process may be used to etch the second substrate to form the MEMS device. Any charge induced by the etching (as well as other processes, including but limited to film deposition processes such as physical vapor deposition or chemical vapor deposition processes, oxygen plasma ashing processes, argon plasma sputter cleaning processes, other plasma environment processes, or combinations thereof) may be discharged via the second portion of the MLI structure that is coupled with the doped region of the first substrate. The method 10 may continue to complete fabrication of the integrated CMOS-MEMS device. For example, the second portion of the MLI structure may be isolated from the MEMS device. The second portion of the MLI structure may be spontaneously disconnected (for example, by etching through the second substrate, such that the second portion of the MLI structure is isolated from the MEMS device) or forcefully disconnected (for example, using a fuse-type structure after packaging) from the MEMS device. Additional steps can be provided before, during, and after the method 10, and some of the steps described can be replaced or eliminated for other embodiments of the method. The discussion that follows illustrates various embodiments of devices, specifically, integrated CMOS-MEMS devices, that can be fabricated according to the method 10 of FIG. 1.

Figure 2:
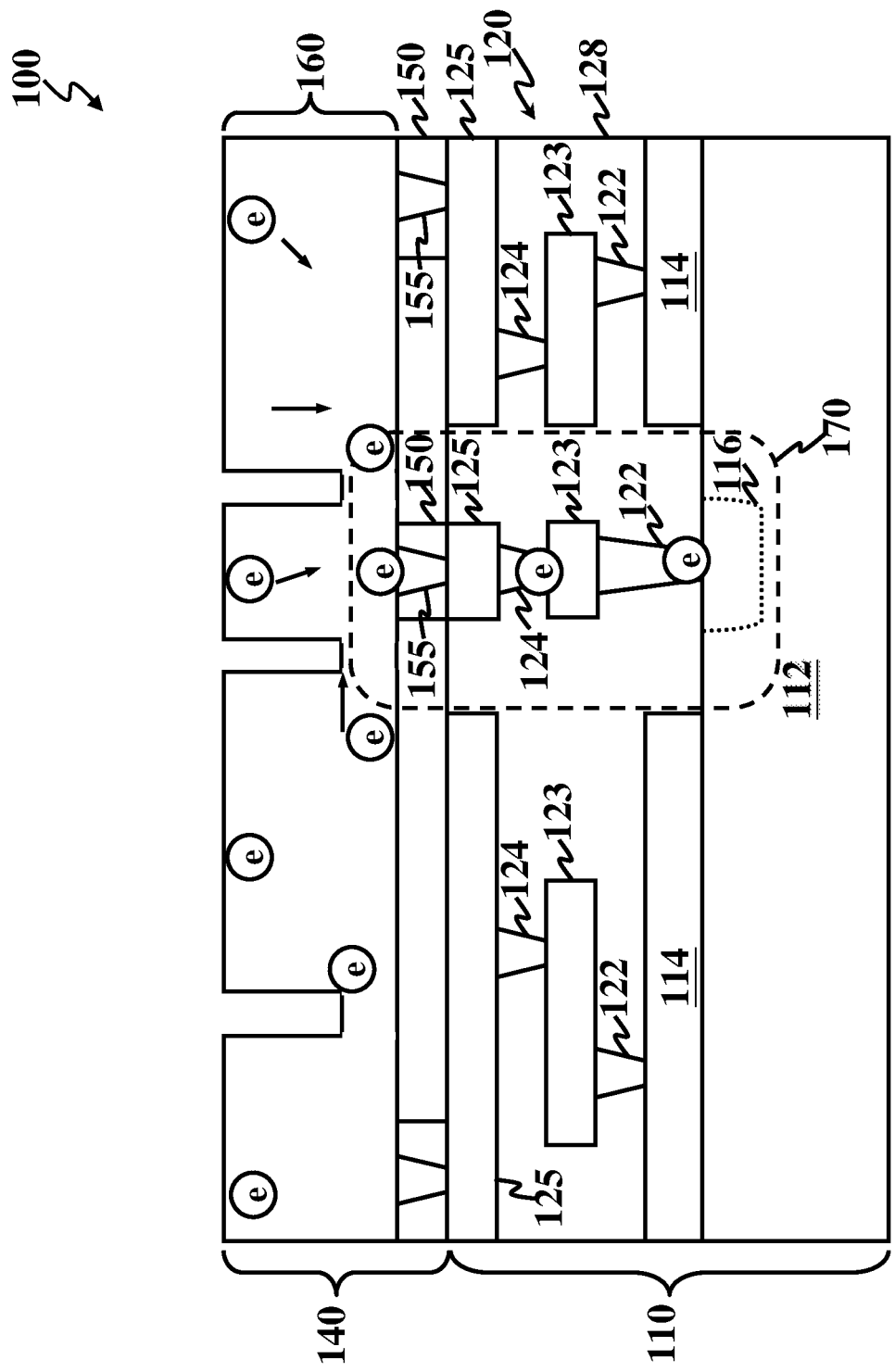
FIGS. 2 and 3 are diagrammatic cross-sectional views of a device during various stages of the method of FIG. 1 according to various aspects of the present disclosure.
Figure 3:
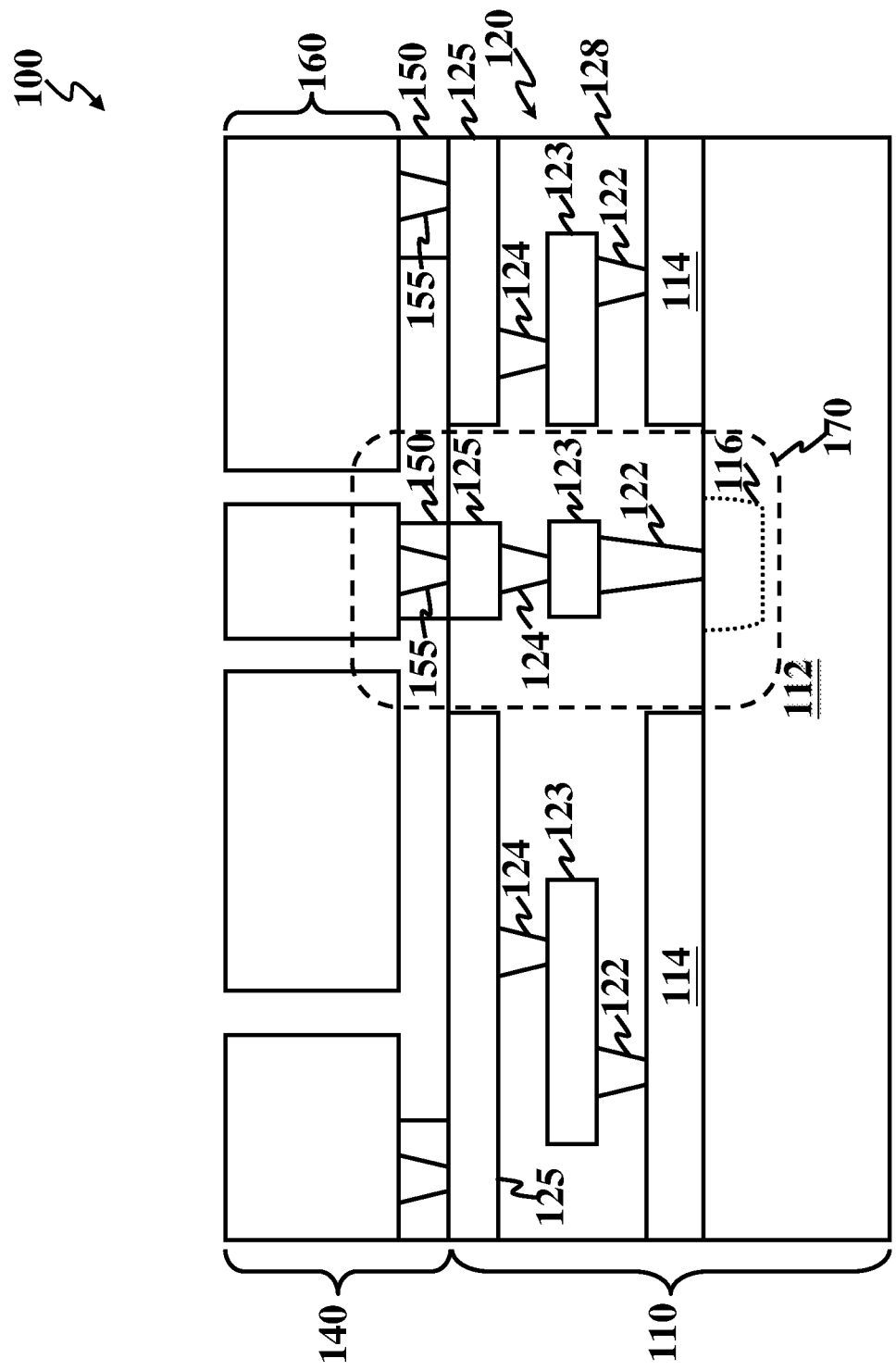

FIGS. 2 and 3 provide diagrammatic cross-sectional views of a device 100, in portion or entirety, at various stages of fabrication according to the method 10 of FIG. 1. In the depicted embodiment, the device 100 includes an integrated circuit device, specifically a CMOS device, integrated with a MEMS device. Accordingly, the device 100 is alternatively referred to as a CMOS-MEMS device. FIGS. 2 and 3 have been simplified for the sake of clarity to better understand the inventive concepts of the present disclosure. Additional features can be added in the device 100, and some of the features described below can be replaced or eliminated for additional embodiments of the device 100.

The device 100 includes a substrate 110. In the depicted embodiment, the substrate 110 includes an integrated circuit device, or portion thereof, designed and formed by CMOS technology based processes. The substrate 110 is thus referred to as a CMOS substrate. Alternatively or additionally, the integrated circuit device may be formed using other integrated circuit fabrication technologies. The CMOS substrate 110 includes a substrate 112. The substrate 112 is a semiconductor substrate, such as a silicon substrate. Alternatively or additionally, the semiconductor substrate includes an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 112 may be a semiconductor on insulator (SOI).

In the depicted embodiment, the substrate 112 includes various layers that are not separately depicted and that combine to form various microelectronic elements 114 that may include: transistors (for example, metal-oxide-semiconductor field-effect transistors (MOSFETs) including CMOS transistors, bipolar junction transistors (BJTs), high voltage transistors, high frequency transistors, p-channel and/or n-channel field-effect transistors (PFETs/NFETs); resistors; diodes; capacitors; inductors; fuses; other suitable elements, or combinations thereof. The various layers may include high-k dielectric layers, gate layers, hard mask layers, interfacial layers, capping layers, diffusion/barrier layers, dielectric layers, conductive layers, other suitable layers, or combinations thereof. The various layers of the substrate 112 may also include various doped regions, isolation features, other features, or combinations thereof. In the depicted embodiment, the microelectronic elements 114 are CMOS devices. Each microelectronic element 114 has a voltage characteristic. For example, each microelectronic element 114 has a breakdown voltage. The microelectronic elements 114 are interconnected to one another to form a portion of the CMOS substrate 110, such as a logic device, memory device (for example, a static random access memory (SRAM)), radio frequency (RF) device, input/output (I/O) device, system-on-chip (SoC) device, other suitable type of device, or combinations thereof.

The substrate 112 includes a doped region 116, which has a greater doping concentration than the substrate 112. In the depicted embodiment, the doped region 116 may be formed in a not illustrated n-well or p-well disposed in the substrate 112, and the doped region 116 is a heavily doped region. For example, the not-illustrated n-well or p-well may have a doping concentration of about $1 \times 10^{16}$ atoms/cm$^3$ to about $1 \times 10^{19}$ atoms/cm$^3$, and the doped region 116 may have a doping concentration of about $1 \times 10^{18}$ atoms/cm$^3$ to about $1 \times 10^{21}$ atoms/cm$^3$. Doping may be implemented using a process such as ion implantation or diffusion in various steps and techniques. The doped region 116 has a voltage characteristic that is different than the voltage characteristic of the microelectronic elements 114. For example, the doped region 116 has a pass through voltage, which in the depicted embodiment, is less than the breakdown voltage of each of the microelectronic elements 114. In the depicted embodiment, the doped region 116 forms a diode, and thus, the pass through voltage may be referred to as a diode forward voltage. In an example, each of the microelectronic elements 114 may have a breakdown voltage of about 5 volts, and the doped region 116 may have a pass through voltage of about 0 volts to about 0.6 volts.

In the depicted embodiment, the CMOS substrate 110 also includes a multilayer interconnect (MLI) structure 120 disposed over the substrate 112. The MLI structure 120 includes various conductive features 122-125, which may be vertical interconnects 122 and 124, such as contacts and/or vias, and/or horizontal interconnects 123 and 125, such as conductive lines. In the depicted embodiment, the conductive lines 125 correspond with a top conductive layer of the MLI structure 120, which may be referred to as a top metal (TM) layer. The various conductive features 122-125 may include conductive materials, such as metal. In an example, metals including aluminum, aluminum/silicon/copper alloy, copper, titanium, titanium nitride, tantalum, tantalum nitride, tungsten, polysilicon, metal silicide, or combinations thereof, may be used, and the various conductive features 122-125 may be referred to as interconnects. In the depicted embodiment, the interconnects may be aluminum contacts, which may be formed by a process including physical vapor deposition (PVD), chemical vapor deposition (CVD), or combinations thereof. Other manufacturing techniques to form the various conductive features 122-125 may include photolithography processing and etching to pattern conductive materials to form the vertical and horizontal connects. Still other manufacturing processes may be implemented to form the MLI structure 120, such as a thermal annealing to form metal silicide. The metal silicide used in the multilayer interconnects may include nickel silicide, cobalt silicide, tungsten silicide, tantalum silicide, titanium silicide, platinum silicide, erbium silicide, palladium silicide, or combinations thereof. Alternatively, the various conductive features 122-125 may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. It is understood that the MLI structure 120 is not limited by the number, material, size, and/or dimension of the conductive features 122-125 depicted, and thus, the MLI structure 120 may include any number, material, size, and/or dimension of conductive features depending on design requirements of the device 100.

The MLI structure 120 is disposed over the microelectronic elements 114 and the doped region 116. In the depicted embodiment, as illustrated in FIG. 2, respective portions of the MLI structure 120 are coupled with each of the microelectronic elements 114, and a portion of the MLI structure 120 is coupled with the doped region 116. In an example, an interface between the portion of the MLI structure 120 and the doped region 116 forms an ohmic contact. The portion of the MLI structure 120 that is coupled with the doped region 116 is isolated from each portion of the MLI structure 120 that is coupled respectively with the microelectronic elements 114. Each portion of the MLI structure 120 that is respectively coupled with the microelectronic elements 114 and doped region 116 extends from the microelectronic elements 114 or doped region 116 to the top conductive features 125 (the top metal layer of the MLI structure 120).

The various conductive features 122-125 of the MLI interconnect structure 120 are disposed in an interlayer (or interlevel) dielectric (ILD) layer 128. The ILD layer 128 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, or combinations thereof. The ILD layer 128 may have a multilayer structure. The ILD layer 128 may be formed by a technique including spin-on coating, CVD, sputtering, or other suitable processes. In an example, the MLI structure 120 and ILD 128 are formed in an integrated process including a damascene process, such as a dual damascene process or single damascene process.

The device 100 further includes a substrate 140 bonded to (coupled with) the substrate 110. The substrate 140 includes an insulating layer 150 including conductive features 155 disposed therein, which is disposed over the MLI structure 120. In the depicted embodiment, the insulating layer 150 is an oxide layer, such as a silicon oxide layer. Alternatively or additionally, the insulating layer may include silicon nitride, silicon oxynitride, other suitable material, or combinations thereof. The conductive features 155 include conductive materials, such as metal. For example, the conductive features 155 include tungsten, titanium, aluminum, copper, alloys thereof, other suitable metals or alloys thereof, or combinations thereof. The conductive features 155 are coupled with the MLI structure 120, specifically the top metal layer of the MLI structure 120 (the conductive features 125). The substrate 140 includes conductive features 155 coupled with the portions of the MLI structure 120 that are coupled with the microelectronic elements 114, thereby providing interconnection between a MEMS device layer 160 of the substrate 140 and the various microelectronic elements 114 of the substrate 110. Further, the conductive features 155 include a conductive feature coupled with the portion of the MLI structure 120 that is coupled with the doped region 116. In an example, the substrate 140 may include the MLI structure 120. In another example, the substrate 140 and the substrate 110 may each include a portion of the MLI structure 120.

In the depicted embodiment, the substrate 140 is etched to form a device designed to interface with the substrate 110. More specifically, the MEMS device layer 160 of the substrate 140 is etched (for example, by a plasma etching process) to form a MEMS device. Accordingly, the substrate 140 is referred to as a MEMS substrate. The MEMS device is a MEMS device of a known type, such as a motion sensor (for example, a gyroscope or an accelerometer). Alternatively, the MEMS device could be a RF MEMS device (for example, an RF switch, resonator, or filter), an optical MEMS device (for example, a MEMS micro-mirror), a MEMS oscillator, a MEMS microphone, and/or any other MEMS type device, including future MEMS type devices. One of ordinary skill in the art will recognize that the MEMS device could alternatively include nanoelectromechanical elements, for example, the MEMS device could alternatively be a nanoelectromechanical systems (NEMS) device. The substrate 140 may also include microelectronic elements, such as those described above with reference to substrate 110. Where the substrate 140 includes various microelectronic elements, the MEMS device may be interconnected to the microelectronic elements. As noted above, in the depicted embodiment, the MEMS device layer 160 is interconnected with the various microelectronic elements 114 of substrate 110 via the conductive features 155.

Typically, etching a MEMS device layer of a MEMS substrate to form a MEMS device generates charge (electrons), which can cause damage to an integrated CMOS-MEMS device, specifically a CMOS substrate of the device. For example, accumulated charge may reach microelectronic elements of the CMOS substrate via the interconnection between the CMOS substrate and the MEMS substrate, causing damage to the microelectronic elements. Such damage (for example, plasma-induced damage (PID) arising when a plasma etching process is used to etch the MEMS device layer to form the MEMS device) may cause device drift, circuit leakage, failed device yield, and/or reduced device reliability. To prevent such damage during the etching process, conventional integrated CMOS-MEMS devices have implemented a protection diode or additional circuit. However, current protection diodes and additional circuits take up greater than desirable area of the device, which can lead to reduced functional device area and increased manufacturing costs. Further, it has been observed that these protection diodes and additional circuits electrically leak, causing reduced device sensitivity and/or increased device power consumption. Additional capacitance associated with such protection circuitry may also be detrimental to the device's sensing performance.

To address damage resulting from the etching process, in the depicted embodiment, the device 100 includes a bypass structure 170. The bypass structure 170 acts as an electrical bypass structure, such that etching-induced charge can be electrically discharged. For example, in FIG. 2, the bypass structure 170 includes the doped region 116, the portion of the MLI structure 120 of the CMOS substrate 110 that is coupled with the doped region 116, and the conductive feature 155 of the MEMS substrate 140 that is coupled with the portion of the MLI structure 120 coupled with the doped region 116. As the MEMS device layer 160 is etched, the etching-induced charge (designated by electrons (e)) is discharged via the bypass structure 170 to the doped region 116, and thus, to the substrate 110. As noted above, the doped region 116 has a different voltage characteristic than the microelectronic elements 114, specifically the doped region 116 has the pass-through voltage that is lower than the breakdown voltage of the microelectronic elements 114. The accumulated charge thus easily travels via the bypass structure 170, instead of the portions of the MLI structure 120 that are coupled with the microelectronic elements 114, thereby preventing damage to the microelectronic elements 114 during the etching process. In an example, the doped region 116 is grounded, and the breakdown voltage of the microelectronic elements 114 is about 5 V. In some cases, the doped region 116 may be eliminated and the portion of the MLI structure 120 that is isolated from the portions of the MLI structure 120 coupled with the microelectronic elements 114 may simply be coupled to the substrate 110.

The bypass structure 170 may be referred to as an electrical bypass structure, since it provides an electrical discharge path for charge generated during an etching process. The bypass structure 170 can minimize etching damage, such as PID damage, reduce area required for the protection diode/circuit, reduce (or eliminate) impact on performance of the microelectronic elements 114 of the CMOS substrate 110, and/or enhance an etching process window available for etching the MEMS device layer 160 to form the MEMS device (since the protection structure 170 can effectively discharge etching-induced charge, thereby improving the tolerance of the integrated CMOS-MEMS device processing (for example, allowing a higher power plasma environment)). The bypass structure 170 is not limited to providing an electrical discharge path for charge generated during the etching process, such as charge generated during the plasma etching process. The bypass structure 170 also serves as an electrical discharge path for charge generated during any processing of the device 100, particularly, charge induced during any plasma environment processes.

In FIG. 3, the bypass structure 170 of the device 100 is isolated from the MEMS device of the MEMS device layer 160. The bypass structure 170, or discharge path, can be spontaneously or forcefully disconnected to isolate such structure/path from the MEMS device. For example, in FIG. 2, as the MEMS device layer 160 is etched through (from one surface to another surface), a portion of the MEMS device layer 160 remains that connects the bypass structure 170 to the entire MEMS device layer 160, such that the bypass structure 170 can electrically discharge any accumulated charge in the MEMS device layer 160. In FIG. 3, in an example, the remaining portion of the MEMS device layer 160 that connects the bypass structure 170 to the entire MEMS device layer 160 may be spontaneously disconnected by etching completely through (from one surface to another surface) the MEMS device layer 160 proximate to the bypass structure 170, such that the bypass structure 170 is coupled with a portion of the MEMS device layer 160 that is isolated from the MEMS device. In another example, the portion of the remaining portion of the MEMS device layer 160 that connects the bypass structure 170 to the entire MEMS device layer 160 may be forcefully disconnected, for example, after packaging using heat and/or electrical power. In one example, the remaining portion of the MEMS device layer 160 that connects the bypass structure 170 to the entire MEMS device layer 160 is patterned to form a fuse-type structure, such that the bypass structure 170 coupled with a portion of the MEMS device layer 160 can be isolated from the MEMS device during packaging. Isolating the bypass structure 170 from the MEMS device can prevent the bypass structure 170 from affecting device performance.

Figure 4:
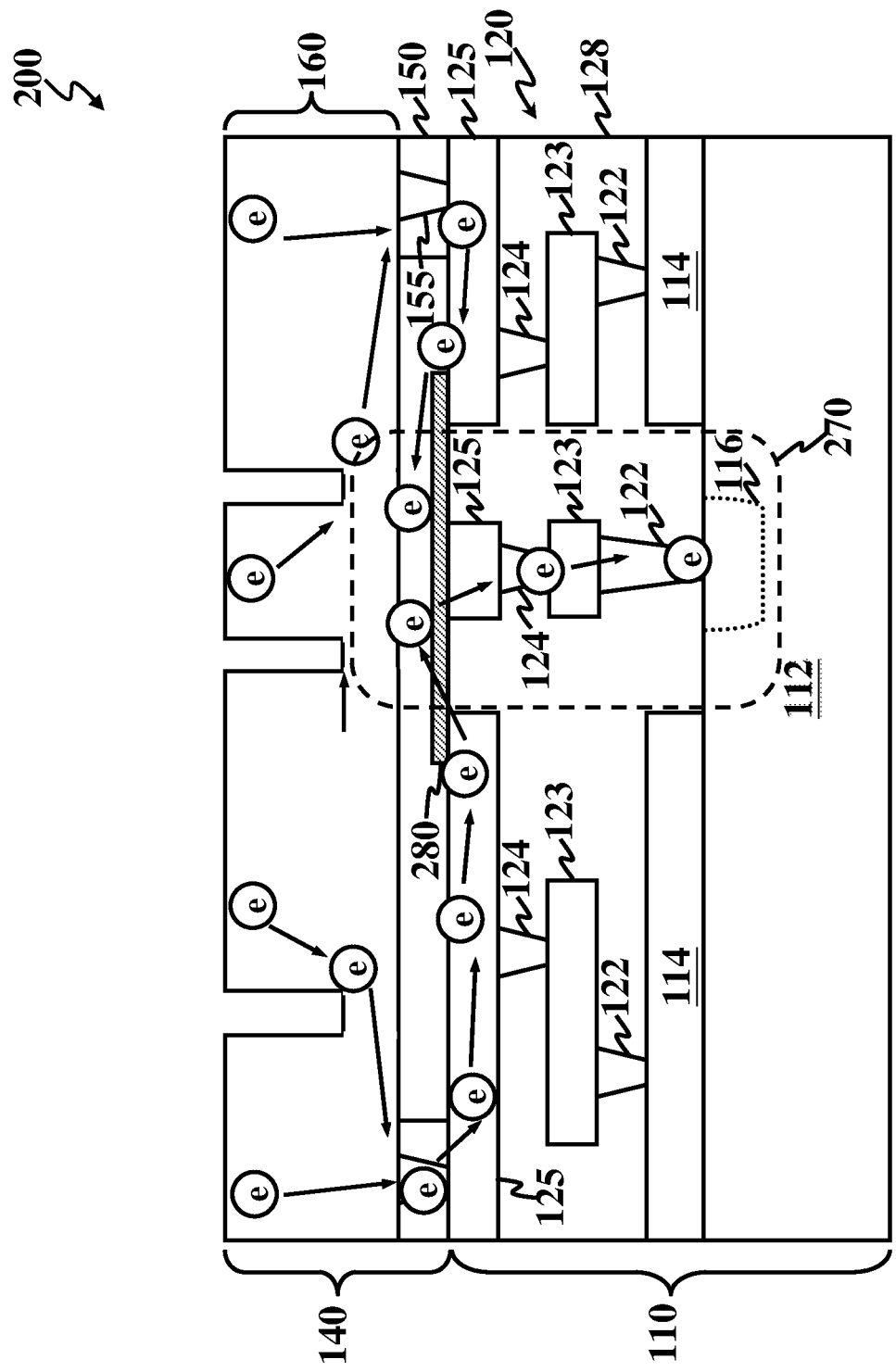
FIGS. 4 and 6 are diagrammatic cross-sectional views.
Figure 5:
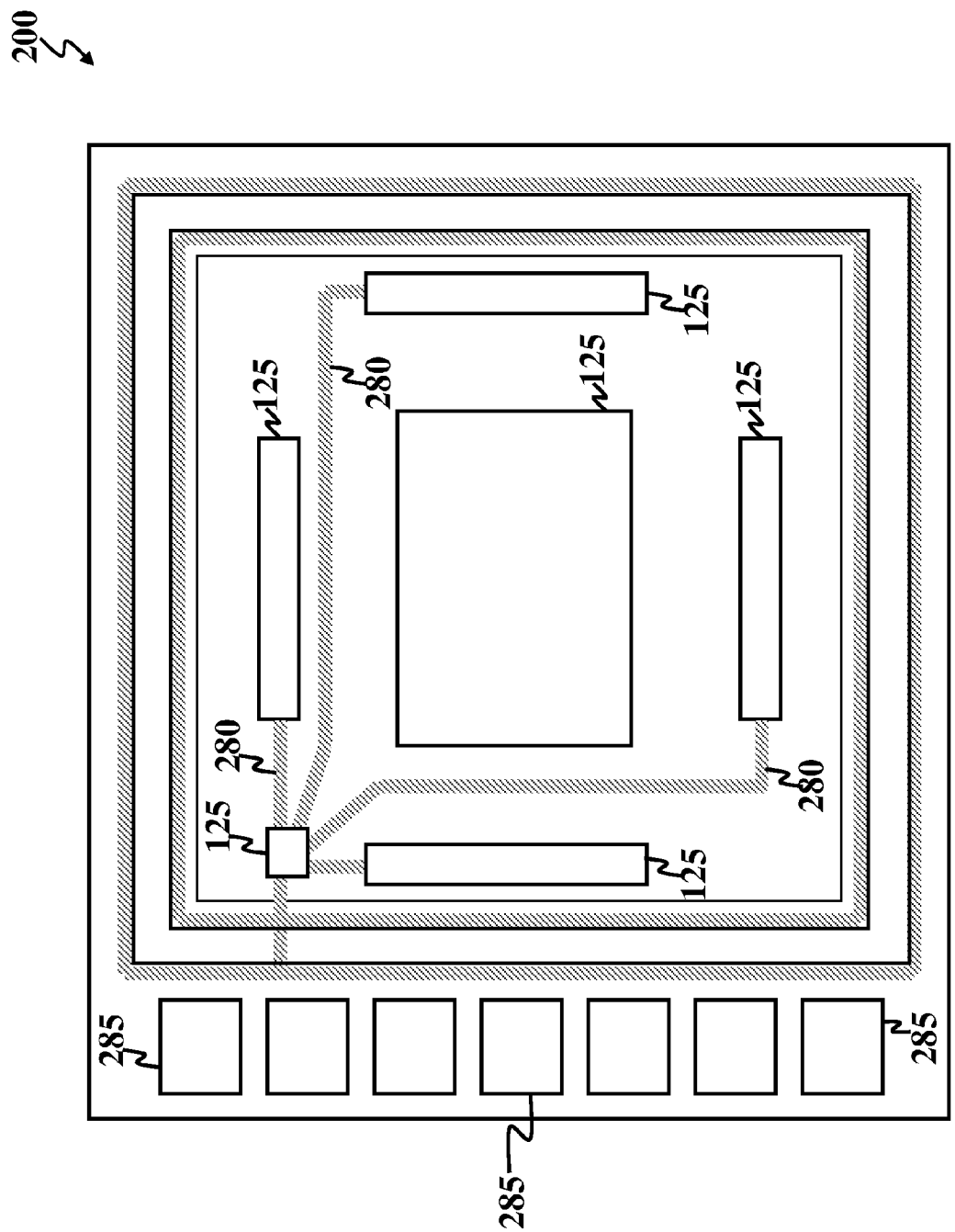
FIGS. 5 and 7 are top views respectively corresponding with FIGS. 4 and 6, of another device during various stages of the method of FIG. 1 according to various aspects of the present disclosure.
Figure 6:
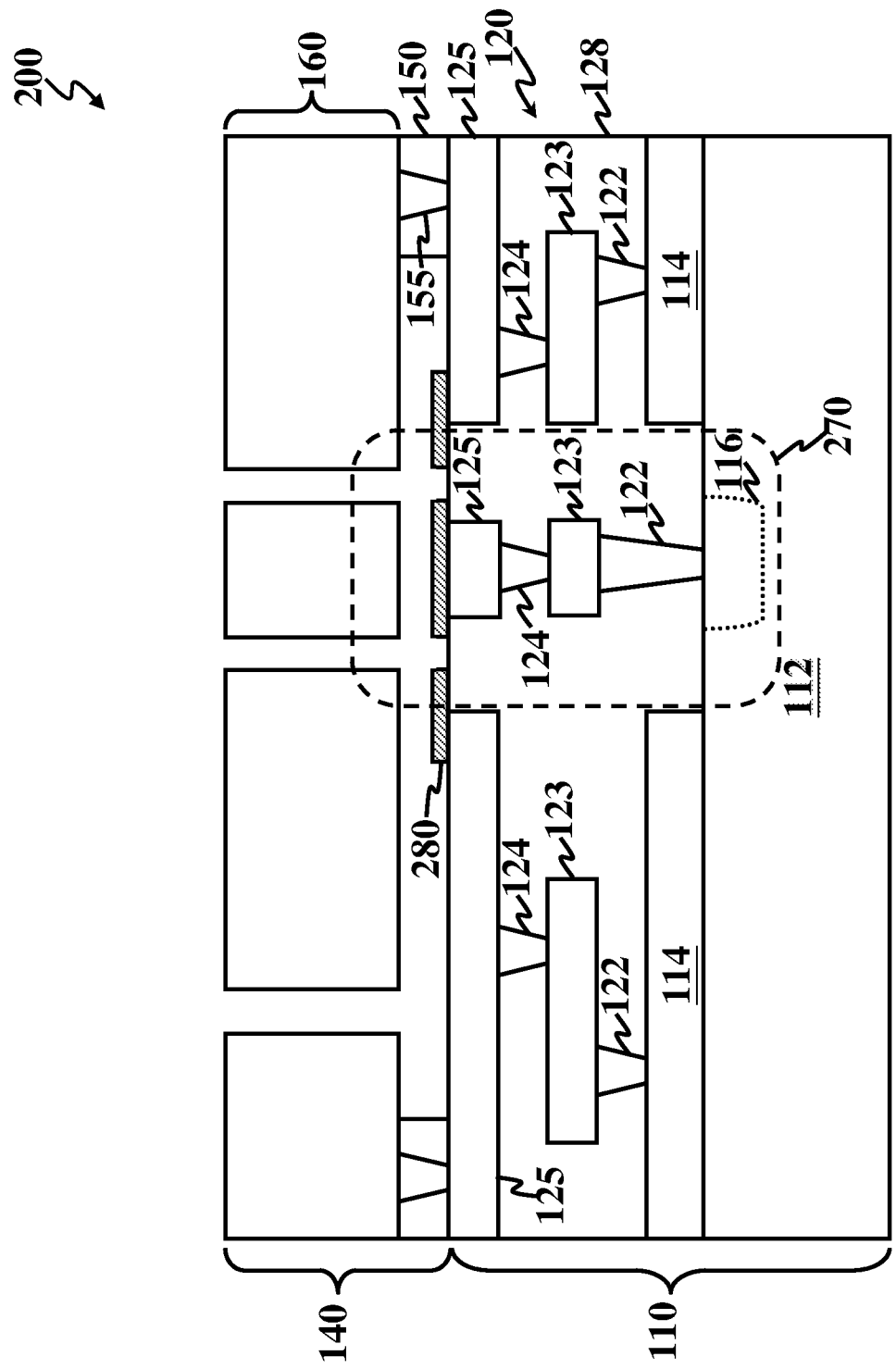
Figure 7:
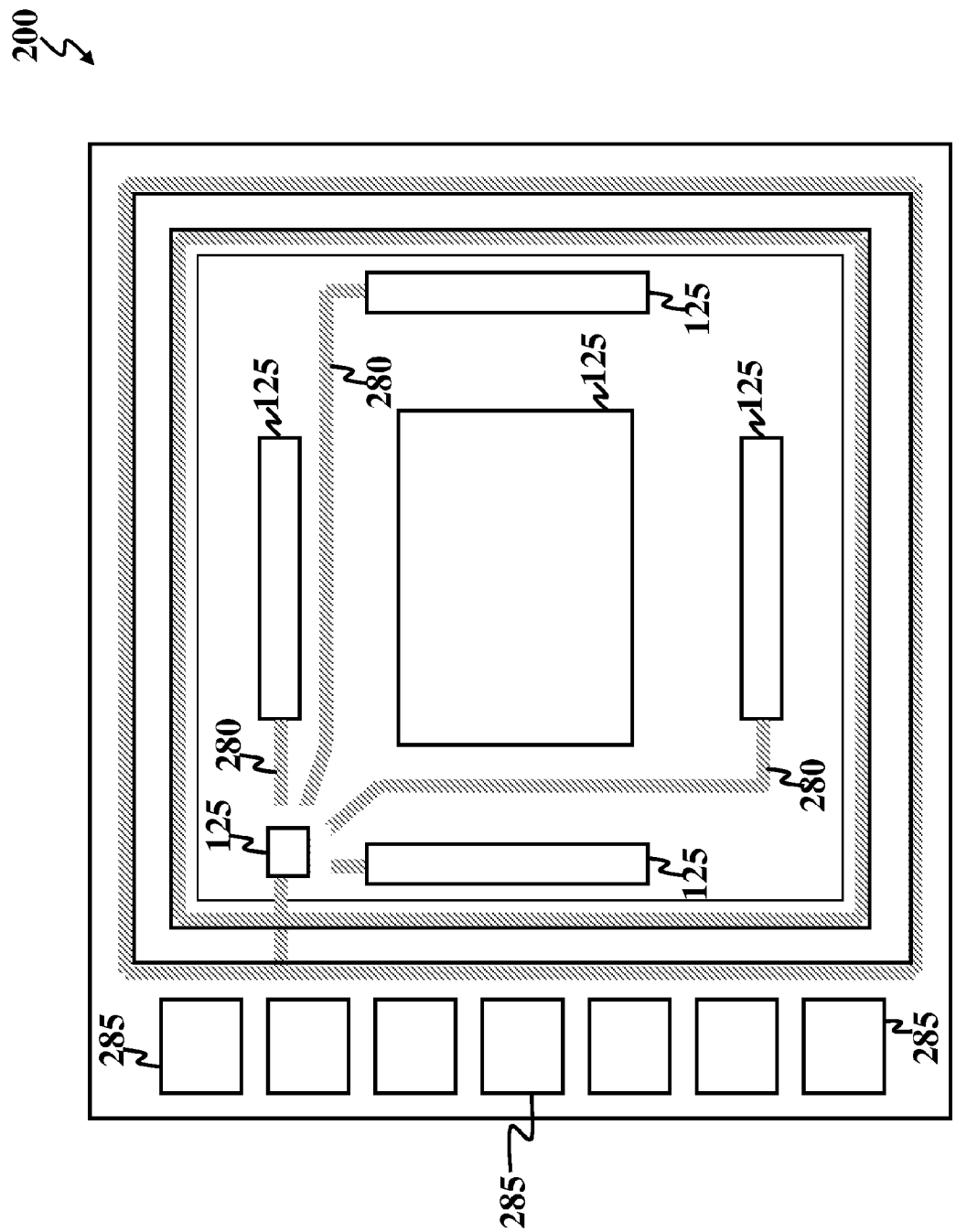

FIGS. 4 and 6 are diagrammatic cross-sectional views, and FIGS. 5 and 7 are top views respectively corresponding with FIGS. 4 and 6, of another device 200, in portion or entirety, at various stages of fabrication according to the method 10 of FIG. 1. The embodiment of FIGS. 4-7 is similar in many respects to the embodiment of FIGS. 2-3. For example, in the depicted embodiment, the device 200 includes an integrated CMOS-MEMS device. Accordingly, similar features in FIGS. 2-3 and 4-7 are identified by the same reference numerals for clarity and simplicity. FIGS. 4-7 have been simplified for the sake of clarity to better understand the inventive concepts of the present disclosure. Additional features can be added in the device 200, and some of the features described below can be replaced or eliminated in other embodiments of the device 200.

In FIGS. 4 and 5, the device 200 includes the CMOS substrate 110, which includes the substrate 112 having the microelectronic elements 114 and the doped region 116. The MLI structure 120 having the conductive features 122-125 is disposed over the substrate 112, specifically the microelectronic elements 114 and the doped region 116. Similar to the device 100, in the device 200, the MLI structure 120 includes portions coupled respectively with the microelectronic elements 114 and the portion coupled with the doped region 116. The device 200 further includes the MEMS substrate 140, which includes the insulating layer 150 having the conductive features 155 disposed therein and the MEMS device layer 160. The conductive features 155 of the MEMS substrate 140 are coupled with the portions of the MLI structure 120 that are respectively coupled with the microelectronic elements 114. In contrast to the device 100 of FIGS. 2 and 3, in the device 200, the portion of the MLI structure 120 that is coupled with the doped region 116 is not coupled with any conductive features 155 disposed in the insulating layer 150. The portion of the MLI structure 120 that is coupled with the doped region 116 is thus not connected to the MEMS device layer 160. It should be noted that the insulating layer 150, the conductive features 155, and the MEMS device layer 160 are omitted from the top view of the device 200 in FIGS. 5 and 7.

In FIGS. 4 and 5, the MEMS device layer 160 is being etched to form the MEMS device. To address damage resulting from the etching process, in the depicted embodiment, the device 200 includes a bypass structure 270. The bypass structure 270 acts as an electrical bypass structure, such that etching-induced charge can be electrically discharged. For example, in FIG. 4, the bypass structure 270 includes the doped region 116, the portion of the MLI structure 120 of the CMOS substrate 110 that is coupled with the doped region 116, and a conductive layer 280. The conductive layer 280 is disposed over the MLI structure 120, and is coupled with a portion (conductive feature 125) of the top metal layer of the MLI structure 120. The conductive layer 280 includes a metal, such as titanium, titanium nitride, titanium tungsten, aluminum, other suitable metals, or combinations thereof. In an example, the conductive features 125 include an aluminum layer having a titanium nitride antireflective layer disposed thereover, and the conductive layer 280 includes a titanium nitride layer disposed over the titanium nitride antireflective layer of the conductive features 125. In an example, the aluminum layer has a thickness greater than about 8,000 Å, the titanium nitride antireflective layer has a thickness of about 100 Å to about 1,000 Å, and the titanium nitride layer has a thickness of about 300 Å to about 1,000 Å. In another example, the conductive features 125 include a titanium nitride layer having an aluminum copper layer disposed thereover, and the conductive layer 280 includes a titanium nitride layer disposed over the aluminum copper layer.

In the depicted embodiment, the conductive layer 280 ties together the portions of the MLI structure 120 that are respectively coupled with the microelectronic elements 114. More specifically, the conductive layer 280 is coupled with each top metal layer (conductive feature 125) that is coupled with the microelectronic elements 114. The conductive layer 280 is tied to ground, the doped region 116 in the depicted embodiment, and the conductive layer 280 thus acts to short the conductive features 125 that are coupled with the microelectronic elements 114, such that differential charge is eliminated between the various conductive features. As the MEMS device layer 160 is etched, the etching-induced charge (designated by electrons (e)) is discharged via the bypass structure 270 to the doped region 116, and thus, to the substrate 112. The bypass structure 270 thereby effectively prevents damage to the microelectronic elements 114 during the etching process. In some cases, the doped region 116 may be eliminated and the portion of the MLI structure 120 included in the bypass structure 270 may simply be coupled to the substrate 112. The device 200 may further include bonding pads 285. In an example, the conductive layer 280 may further be coupled with one of the bonding pads 285, which may be grounded, to achieve similar shorting effects, thereby preventing etching-induced damage.

The bypass structure 270 may be referred to as an electrical bypass structure, since it provides an electrical discharge path for charge generated during an etching process. The bypass structure 270 can minimize etching damage, such as PID damage, reduce area required for the protection diode/circuit, reduce (or eliminate) impact on performance of the microelectronic elements 114 of the CMOS substrate 110, and/or enhance an etching process window available for etching the MEMS device layer 160 to form the MEMS device (since the protection structure 270 can effectively discharge etching-induced charge, thereby improving the tolerance of the integrated CMOS-MEMS device processing (for example, allowing a higher power plasma environment)). The bypass structure 270 is not limited to providing an electrical discharge path for charge generated during the etching process, such as charge generated during the plasma etching process. The bypass structure 270 also serves as an electrical discharge path for charge generated during any processing of the device 200, particularly, charge induced during any plasma environment processes.

In FIGS. 6 and 7, the bypass structure 270, or discharge path, of the device 200 is isolated from the portions of the MLI structure 120 that are coupled with the microelectronic devices 114. For example, in FIGS. 6 and 7, while the MEMS device layer 160 is etched to form the MEMS device, the MEMS device layer is etched through (from one surface to another surface) to expose portions of the conductive layer 280. The conductive layer 280 exposed by the openings in the MEMS device layer 160 is removed by an etching process, thereby isolating the portion of the MLI structure 120 coupled with the doped region 116 from the portions of the MLI structure 120 coupled with the microelectronic elements 114.

Figure 8:
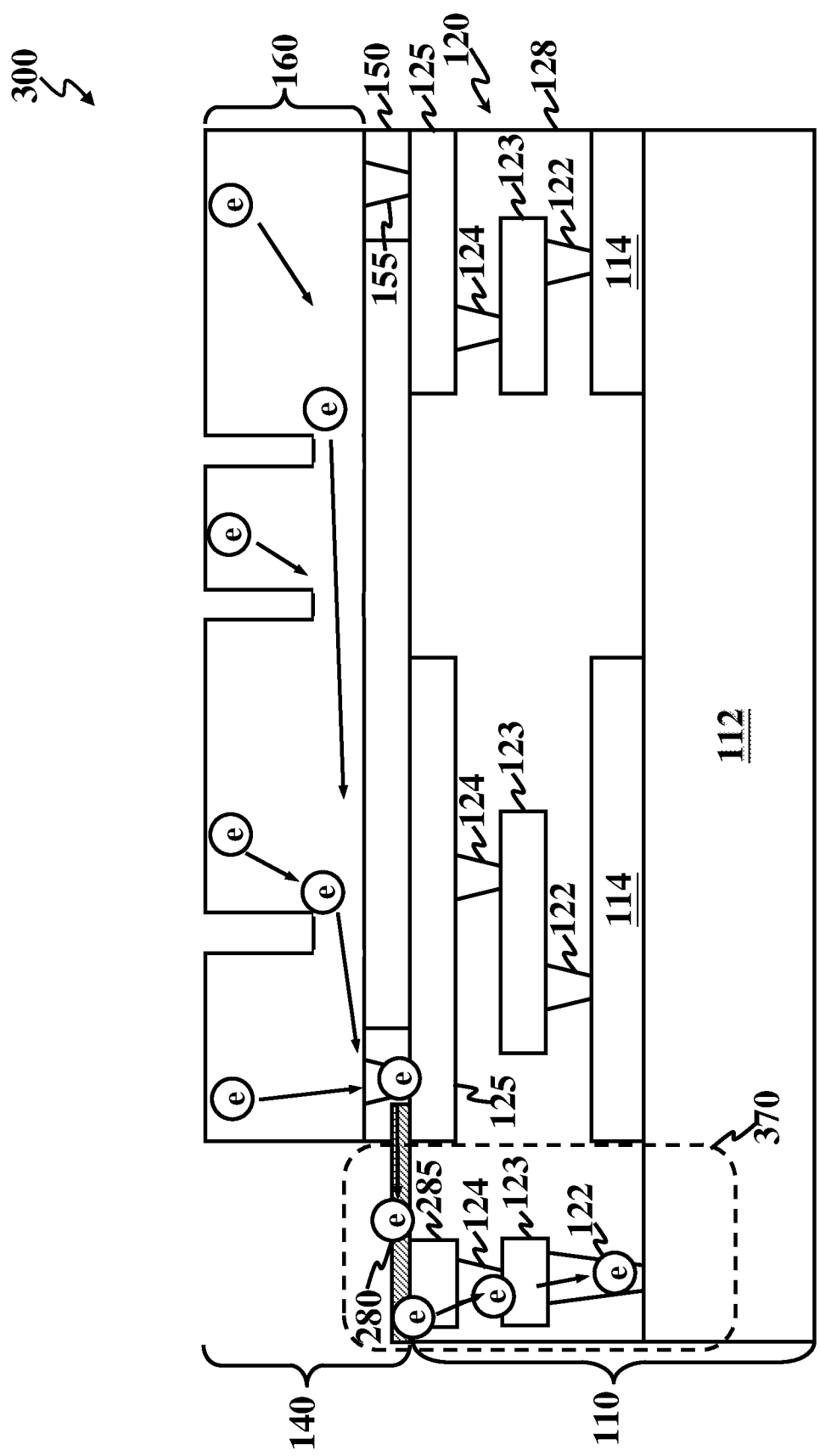
FIGS. 8 and 10 are diagrammatic cross-sectional views.
Figure 9:
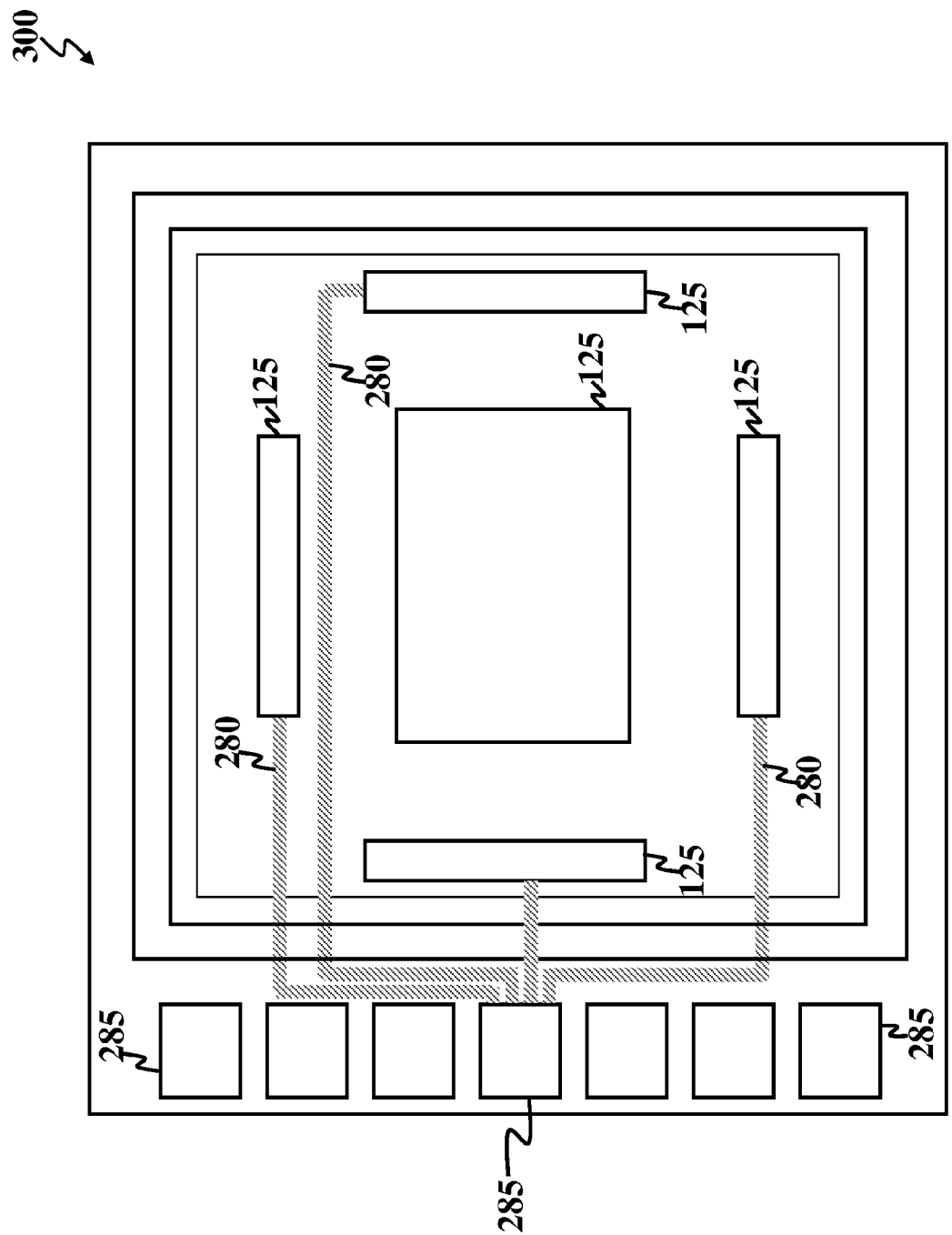
FIGS. 9 and 11 are top views respectively corresponding with FIGS. 8 and 10, of yet another device during various stages of the method of FIG. 1 according to various aspects of the present disclosure.
Figure 10:
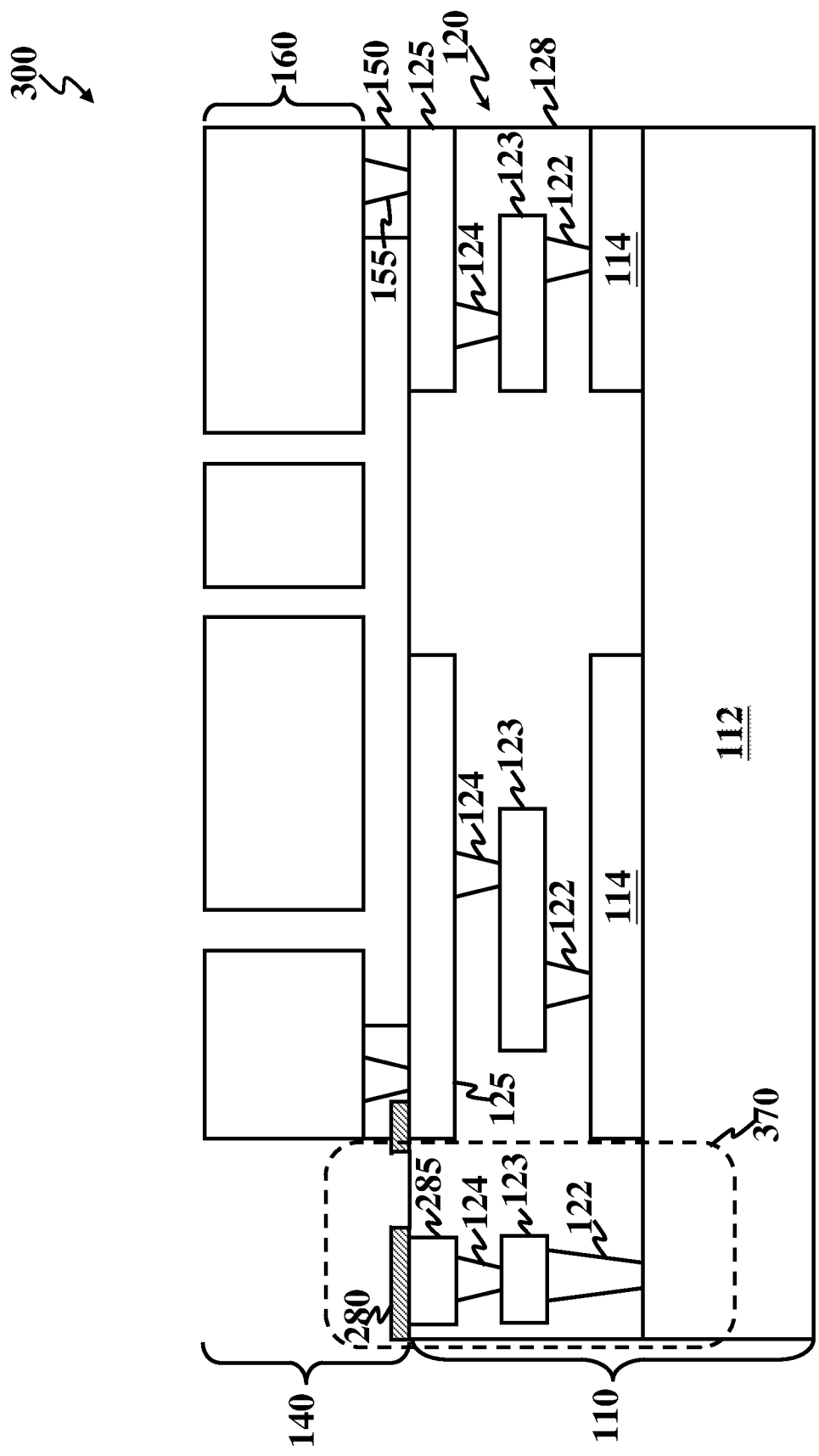
Figure 11:
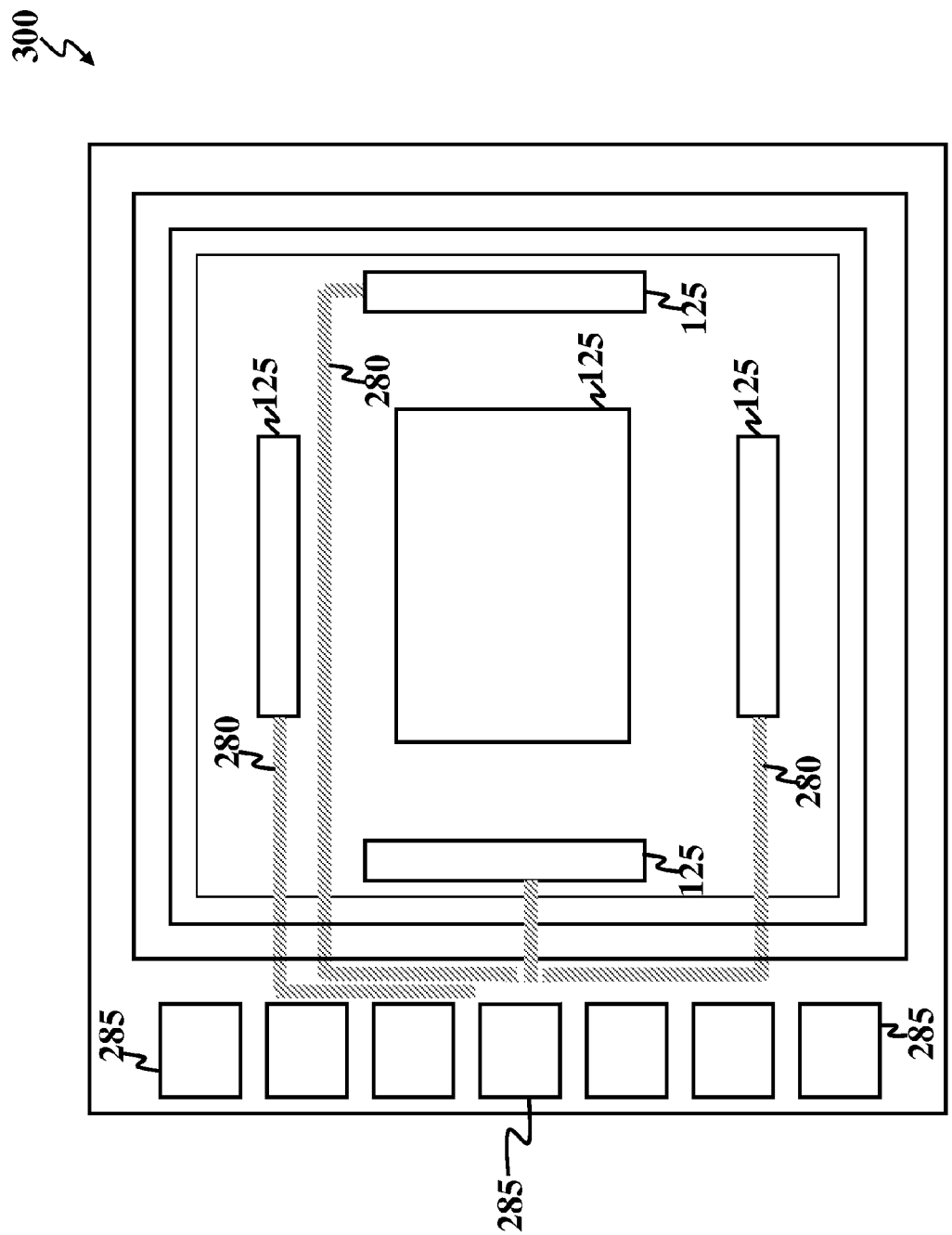

FIGS. 8 and 10 are diagrammatic cross-sectional views, and FIGS. 9 and 11 are top views respectively corresponding with FIGS. 8 and 10, of yet another device 300, in portion or entirety, at various stages of fabrication according to the method 10 of FIG. 1. The embodiment of FIGS. 8-11 is similar in many respects to the embodiments of FIGS. 2-7. For example, in the depicted embodiment, the device 300 includes a CMOS-MEMS device. Accordingly, similar features in FIGS. 2-7 and 8-11 are identified by the same reference numerals for clarity and simplicity. FIGS. 8-11 have been simplified for the sake of clarity to better understand the inventive concepts of the present disclosure. Additional features can be added in the device 300, and some of the features described below can be replaced or eliminated in other embodiments of the device 300.

In FIGS. 8 and 9, the device 300 includes the CMOS substrate 110, which includes the substrate 112 having the microelectronic elements 114. The MLI structure 120 having the conductive features 122-125 is disposed over the substrate 112, specifically the microelectronic elements 114. Similar to the device 100, in the device 300, the MLI structure 120 includes portions coupled respectively with the microelectronic elements 114. The device 300 further includes the MEMS substrate 140, which includes the insulating layer 150 having the conductive features 155 disposed therein and the MEMS device layer 160. The conductive features 155 of the MEMS substrate 140 are coupled with the portions of the MLI structure 120 that are respectively coupled with the microelectronic elements 114. In contrast to the devices 100 and 200 of FIGS. 2-6, in the device 300, a portion of the MLI structure 120 is coupled with the substrate 112, which may be coupled with a doped region formed in the substrate 112. The portion of the MLI structure 120 coupled with the substrate 112 is disposed outside the MEMS substrate 140, and the top metal layer of the MLI structure 120 coupled with the substrate 112 is one of the bonding pads 285. It should be noted that the insulating layer 150, the conductive features 155, and the MEMS device layer 160 are omitted from the top view of the device 300 in FIGS. 9 and 11.

In FIGS. 8 and 9, the MEMS device layer 160 is being etched to form the MEMS device. To address damage resulting from the etching process, in the depicted embodiment, the device 300 includes a bypass structure 370. The bypass structure 370 acts as an electrical bypass structure, such that etching-induced charge can be electrically discharged. For example, in FIG. 8, the bypass structure 370 includes the conductive layer 280 and the portion of the MLI structure 120 of the CMOS substrate 110 that is coupled with the substrate 112. The conductive layer 280 is disposed over the MLI structure 120, and is coupled with a portion of the top metal layer of the MLI structure 120, specifically one of the bonding pads 285. In the depicted embodiment, each top metal layer (conductive feature 125) of the portions of the MLI structure 120 respectively coupled with the microelectronic elements 114 is separately coupled with the bonding pad 285 via the conductive layer 280. The conductive layer 280 is tied to ground, via the grounded bonding pad 285, and the conductive layer 280 thus acts to short the conductive features 125 that are coupled with the microelectronic elements 114, such that differential charge is eliminated between the various conductive features. As the MEMS device layer 160 is etched, the etching-induced charge (designated by electrons (e)) is discharged via the bypass structure 370 to the substrate 112. The bypass structure 370 thereby effectively prevents damage to the microelectronic elements 114 during the etching process.

The bypass structure 370 may be referred to as an electrical bypass structure, since it provides an electrical discharge path for charge generated during an etching process. The bypass structure 370 can minimize etching damage, such as PID damage, reduce area required for the protection diode/circuit, reduce (or eliminate) impact on performance of the microelectronic elements 114 of the CMOS substrate 110, and/or enhance an etching process window available for etching the MEMS device layer 160 to form the MEMS device (since the protection structure 370 can effectively discharge etching-induced charge, thereby improving the tolerance of the integrated CMOS-MEMS device processing (for example, allowing a higher power plasma environment)). The bypass structure 370 is not limited to providing an electrical discharge path for charge generated during the etching process, such as charge generated during the plasma etching process. The bypass structure 370 also serves as an electrical discharge path for charge generated during any processing of the device 300, particularly, charge induced during any plasma environment processes.

In FIGS. 10 and 11, the bypass structure 370, or discharge path, of the device 300 is isolated from the portions of the MLI structure 120 that are coupled with the microelectronic devices 114. For example, in FIGS. 10 and 11, after the MEMS device layer 160 is etched to form the MEMS device, an etching process may be used to remove portions of the conductive layer 280 in the area outside the MEMS substrate 140, thereby isolating the portion of the MLI structure 120 coupled with the substrate 112 from the portions of the MLI structure 120 coupled with the microelectronic elements 114.

Figure 12:
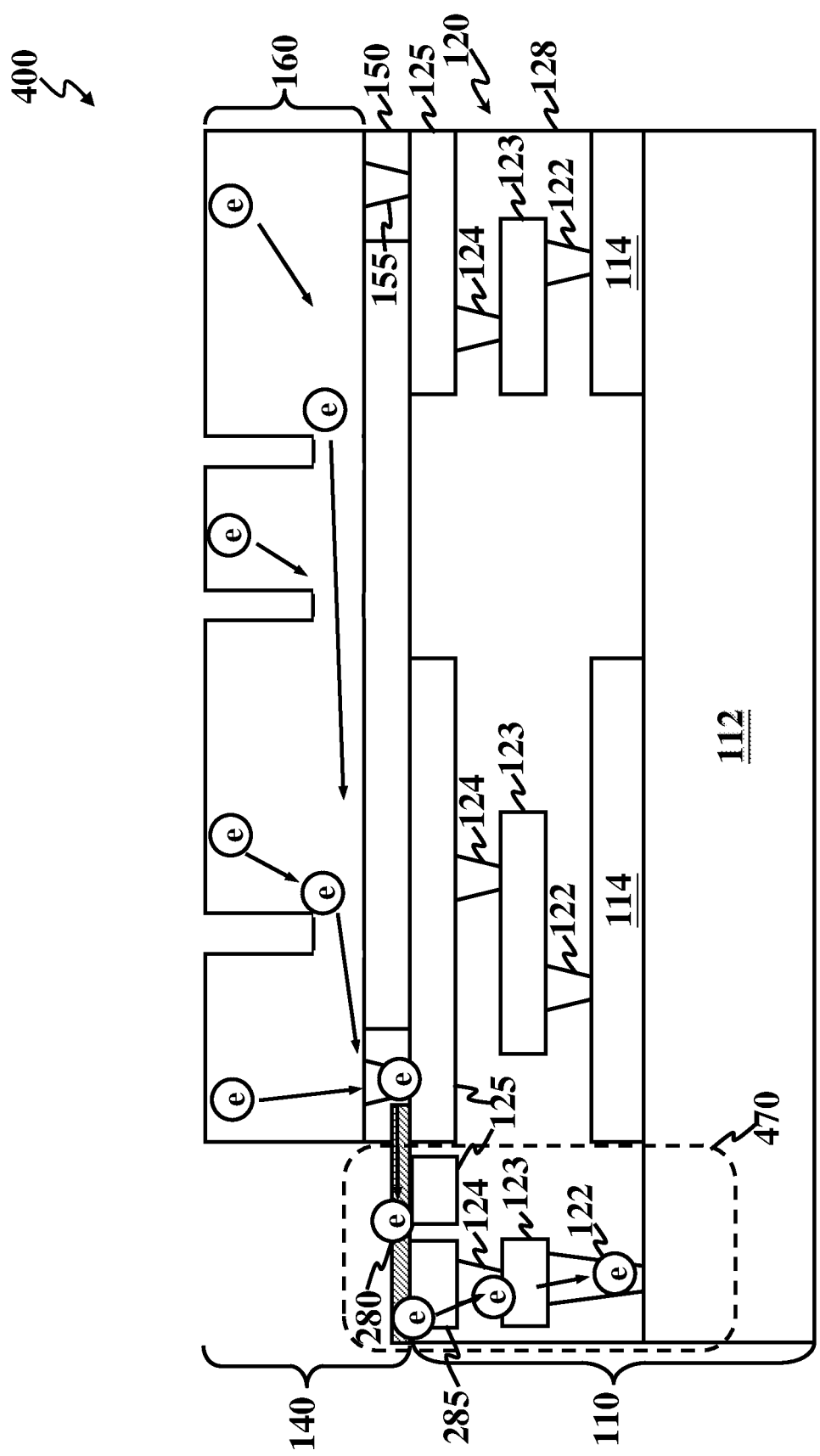
FIGS. 12 and 14 are diagrammatic cross-sectional views.
Figure 13:
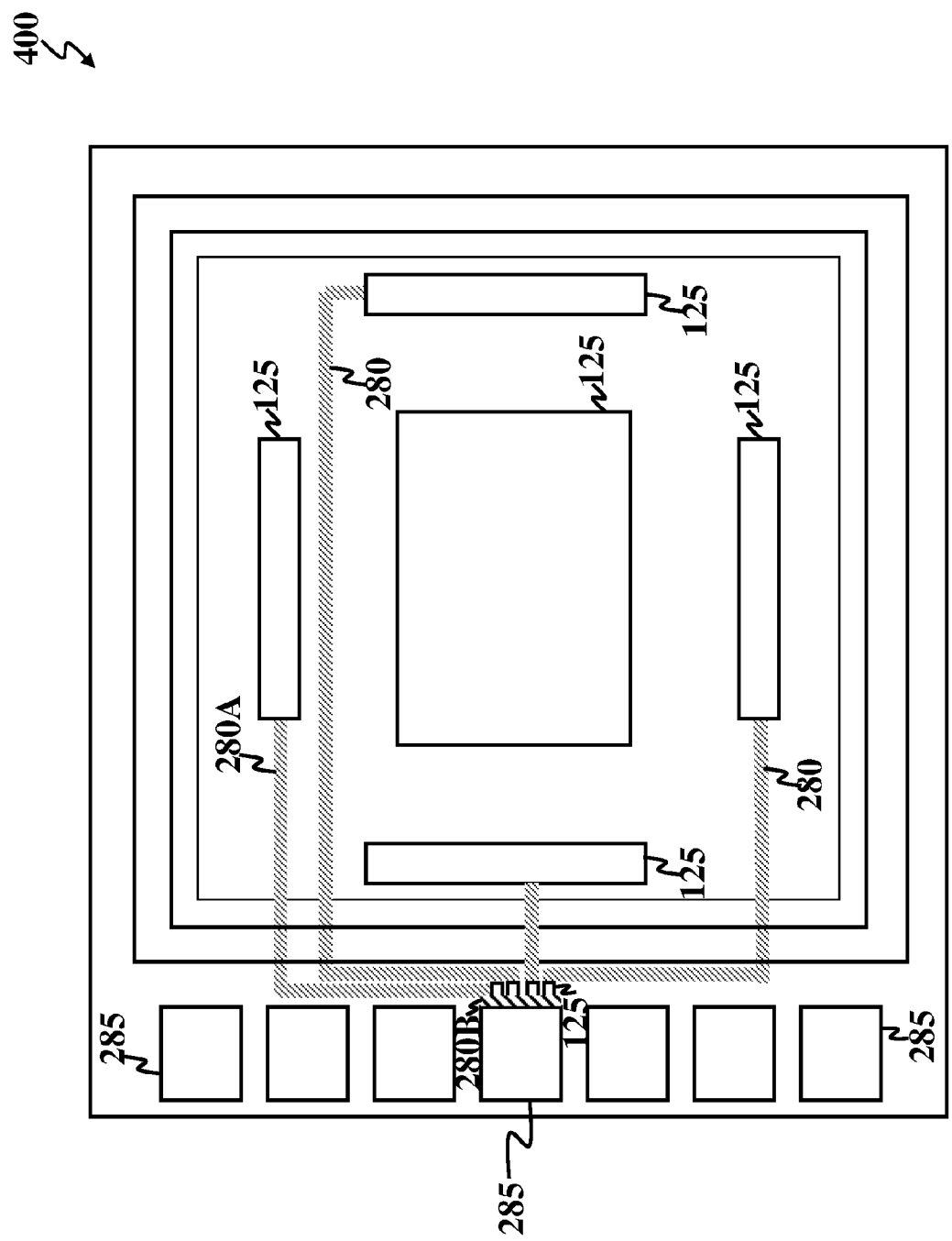
FIGS. 13 and 15 are top views respectively corresponding with FIGS. 12 and 14, of yet another device during various stages of the method of FIG. 1 according to various aspects of the present disclosure.
Figure 14:
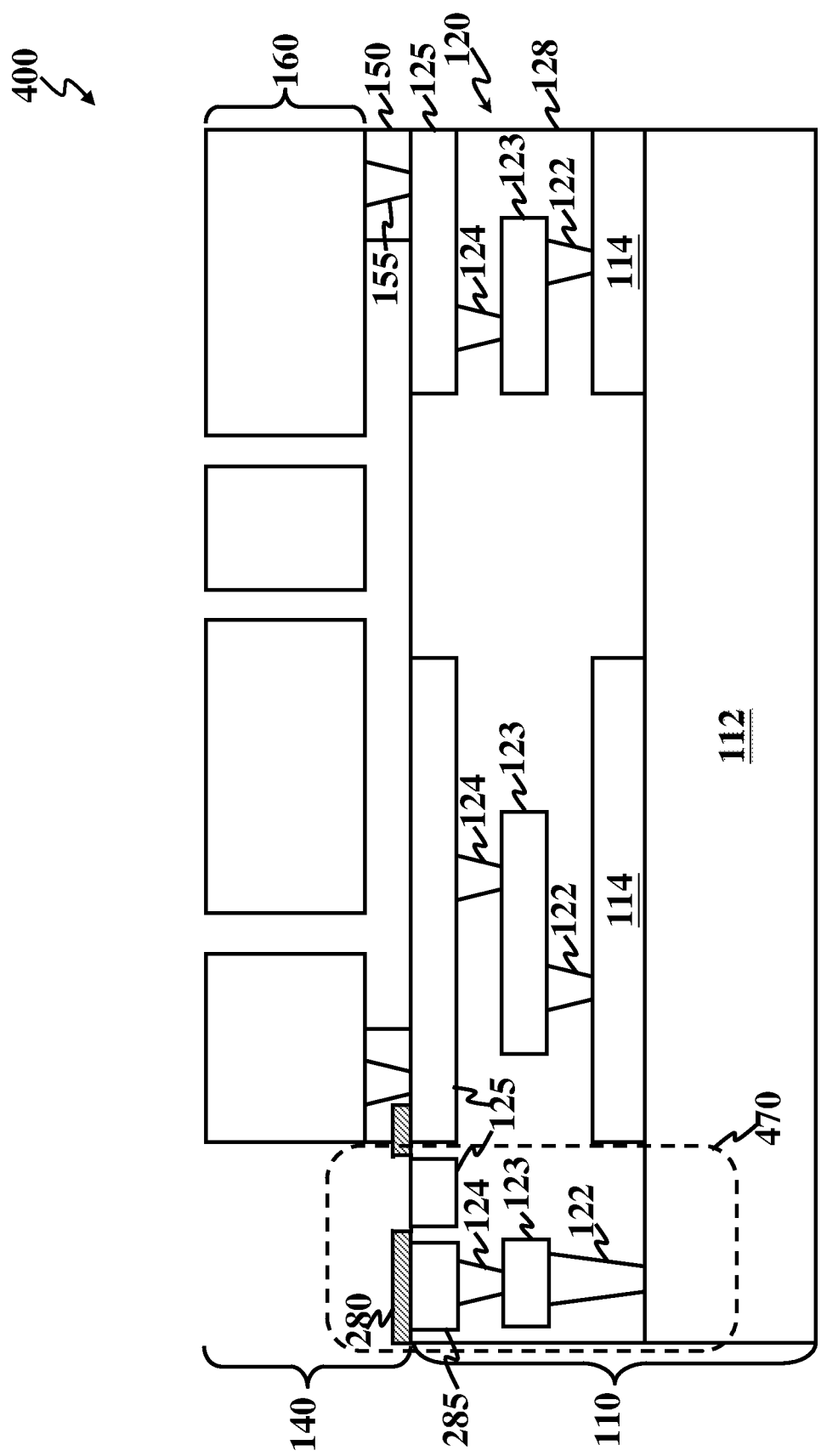
Figure 15:
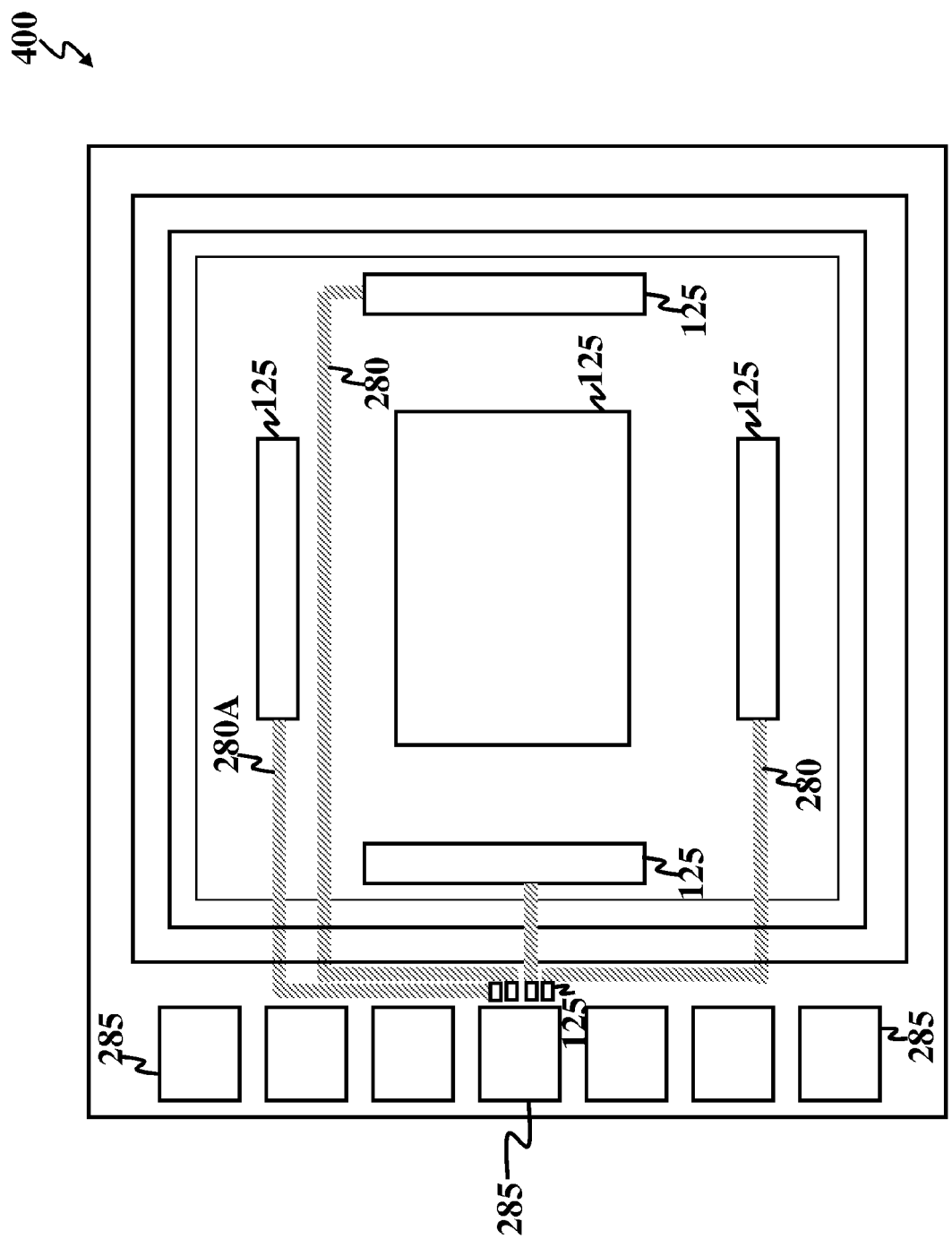

FIGS. 12 and 14 are diagrammatic cross-sectional views, and FIGS. 13 and 15 are top views corresponding respectively with FIGS. 12 and 14, of yet another device 400, in portion or entirety, at various stages of fabrication according to the method 10 of FIG. 1. The embodiment of FIGS. 12-15 is similar in many respects to the embodiments of FIGS. 2-11. For example, in the depicted embodiment, the device 400 includes a CMOS-MEMS device. Accordingly, similar features in FIGS. 2-11 and 12-15 are identified by the same reference numerals for clarity and simplicity. FIGS. 12-15 have been simplified for the sake of clarity to better understand the inventive concepts of the present disclosure. Additional features can be added in the device 400, and some of the features described below can be replaced or eliminated in other embodiments of the device 400.

In FIGS. 12 and 13, the device 400 includes the CMOS substrate 110, which includes the substrate 112 having the microelectronic elements 114. The MLI structure 120 having the conductive features 122-125 is disposed over the substrate 112, specifically the microelectronic elements 114. The MLI structure 120 includes portions coupled respectively with the microelectronic elements 114. The device 400 further includes the MEMS substrate 140, which includes the insulating layer 150 having the conductive features 155 disposed therein and the MEMS device layer 160. The conductive features 155 of the MEMS substrate 140 are coupled with the portions of the MLI structure 120 that are respectively coupled with the microelectronic elements 114. Similar to the device 300 of FIGS. 8-11, the device 400 includes a portion of the MLI structure 120 that is coupled with the substrate 112, which may be coupled with a doped region formed in the substrate 112. The portion of the MLI structure 120 coupled with the substrate 112 is disposed outside the MEMS substrate 140, and the top metal layer of the MLI structure 120 coupled with the substrate 112 is one of the bonding pads 285. It should be noted that the insulating layer 150, the conductive features 155, and the MEMS device layer 160 are omitted from the top view of the device 400 in FIGS. 13 and 15.

In FIGS. 12 and 13, the MEMS device layer 160 is being etched to form the MEMS device. To address damage resulting from the etching process, in the depicted embodiment, the device 400 includes a bypass structure 470. The bypass structure 470 acts as an electrical bypass structure, such that etching-induced charge can be electrically discharged. For example, in FIG. 12, the bypass structure 470 includes the conductive layer 280 and the portion of the MLI structure 120 of the CMOS substrate 110 that is coupled with the substrate 112, which includes one of the bonding pads 285 as the top metal layer of the MLI structure 120. In the depicted embodiment, the conductive layer 280 includes conductive layer 280A and conductive layer 280B. Each top metal layer (conductive feature 125) of the portions of the MLI structure 120 respectively coupled with the microelectronic elements 114 is coupled to another top metal layer (conductive feature 125) of the MLI structure 120 that is adjacent to the bonding pad 285, which are coupled with the bonding pad 285 via the conductive layer 280B. In processing, the conductive layer 280A may first be formed, such that each top metal layer (conductive feature 125) of the portions of the MLI structure 120 respectively coupled with the microelectronic elements 114 is coupled to another top metal layer (conductive feature 125) of the MLI structure 120 that is proximate to the bonding pad 285. Then, the conductive layer 280B may be formed, such that the top metal layers (conductive features 125) of the MLI structure proximate to the bonding pad 285 are coupled with the bonding pad 285. The conductive layer 280 is tied to ground, via the grounded bonding pad 285, and the conductive layer 280 thus acts to short the conductive features 125 that are coupled with the microelectronic elements 114, such that differential charge is eliminated between the various conductive features. As the MEMS device layer 160 is etched, the etching-induced charge (designated by electrons (e)) is discharged via the bypass structure 470 to the substrate 112. The bypass structure 470 thereby effectively prevents damage to the microelectronic elements 114 during the etching process.

The bypass structure 470 may be referred to as an electrical bypass structure, since it provides an electrical discharge path for charge generated during an etching process. The bypass structure 470 can minimize etching damage, such as PID damage, reduce area required for the protection diode/circuit, reduce (or eliminate) impact on performance of the microelectronic elements 114 of the CMOS substrate 110, and/or enhance an etching process window available for etching the MEMS device layer 160 to form the MEMS device (since the protection structure 470 can effectively discharge etching-induced charge, thereby improving the tolerance of the integrated CMOS-MEMS device processing (for example, allowing a higher power plasma environment)). The bypass structure 470 is not limited to providing an electrical discharge path for charge generated during the etching process, such as charge generated during the plasma etching process. The bypass structure 470 also serves as an electrical discharge path for charge generated during any processing of the device 400, particularly, charge induced during any plasma environment processes.

In FIGS. 14 and 15, the bypass structure 470, or discharge path, of the device 400 is isolated from the portions of the MLI structure 120 that are coupled with the microelectronic devices 114. For example, in FIGS. 14 and 15, after the MEMS device layer 160 is etched to form the MEMS device, an etching process may be used to remove portions of the conductive layer 280, specifically the conductive layer 280B, in the area outside the MEMS substrate 140, thereby isolating the portion of the MLI structure 120 coupled with the substrate 112 from the portions of the MLI structure 120 coupled with the microelectronic elements 114.

Figure 16:
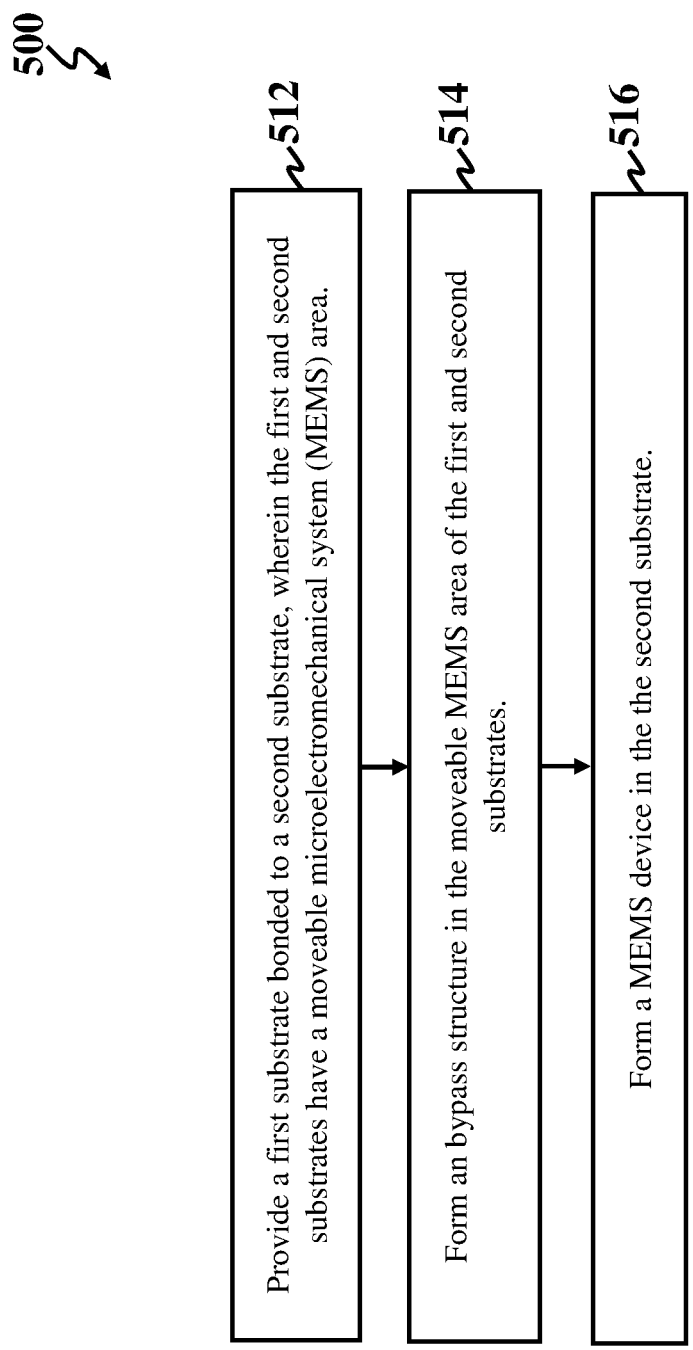
FIG. 16 is a flow chart of a method for fabricating a device according to various aspects of the present disclosure.

FIG. 16 is a flow chart of a method 500 for fabricating a device according to various aspects of the present disclosure. The method 500 fabricates a MEMS device. At block 512, a first substrate and a second substrate are provided, where the first substrate is bonded to the second substrate. In an example, the first substrate is a carrier wafer, and the second substrate is a MEMS substrate. The bonded first and second substrate include a movable MEMS area, which is an area of the bonded first and second substrates where movable features or portions of a MEMS structure will be formed. At block 514, a bypass structure is formed in the movable MEMS area. The bypass structure extends from the second substrate to the first substrate, such that the second substrate is coupled with the first substrate. In an example, the second substrate is coupled with a grounded portion of the first substrate. The bypass structure may be a conductive feature coupled with the first substrate. In an example, the conductive feature is coupled with a doped region disposed in the first substrate. In an example, an interface between the conductive feature and the first substrate is an ohmic contact. The bypass structure may be formed at any time. For example, a portion of the bypass structure may be formed before bonding the first and second substrates, and a portion of the bypass structure may be formed after bonding the first and second substrates. In another example, the bypass structure is formed after bonding the first and second substrates. At block 516, a MEMS device is formed in the second substrate. For example, a plasma etching process may be used to etch the second substrate to form the MEMS device. Any charge induced by the etching (as well as other processes, including but limited to film deposition processes such as physical vapor deposition or chemical vapor deposition processes, oxygen plasma ashing processes, argon plasma sputter cleaning processes other plasma environment processes, or combinations thereof) may be discharged via the bypass structure. The method 500 may continue to complete fabrication of the MEMS device. For example, the bypass structure may be isolated from the MEMS device. Additional steps can be provided before, during, and after the method 500, and some of the steps described can be replaced or eliminated for other embodiments of the method.

The discussion that follows illustrates a device, specifically, a MEMS device, that can be fabricated according to the method 500 of FIG. 16. FIGS. 17-26 provide diagrammatic cross-sectional views of a device 600, in portion or entirety, at various stages of fabrication according to the method 500 of FIG. 16. FIGS. 17-26 have been simplified for the sake of clarity to better understand the inventive concepts of the present disclosure. Additional features can be added in the device 600, and some of the features described below can be replaced or eliminated for additional embodiments of the device 600.

Figure 17:
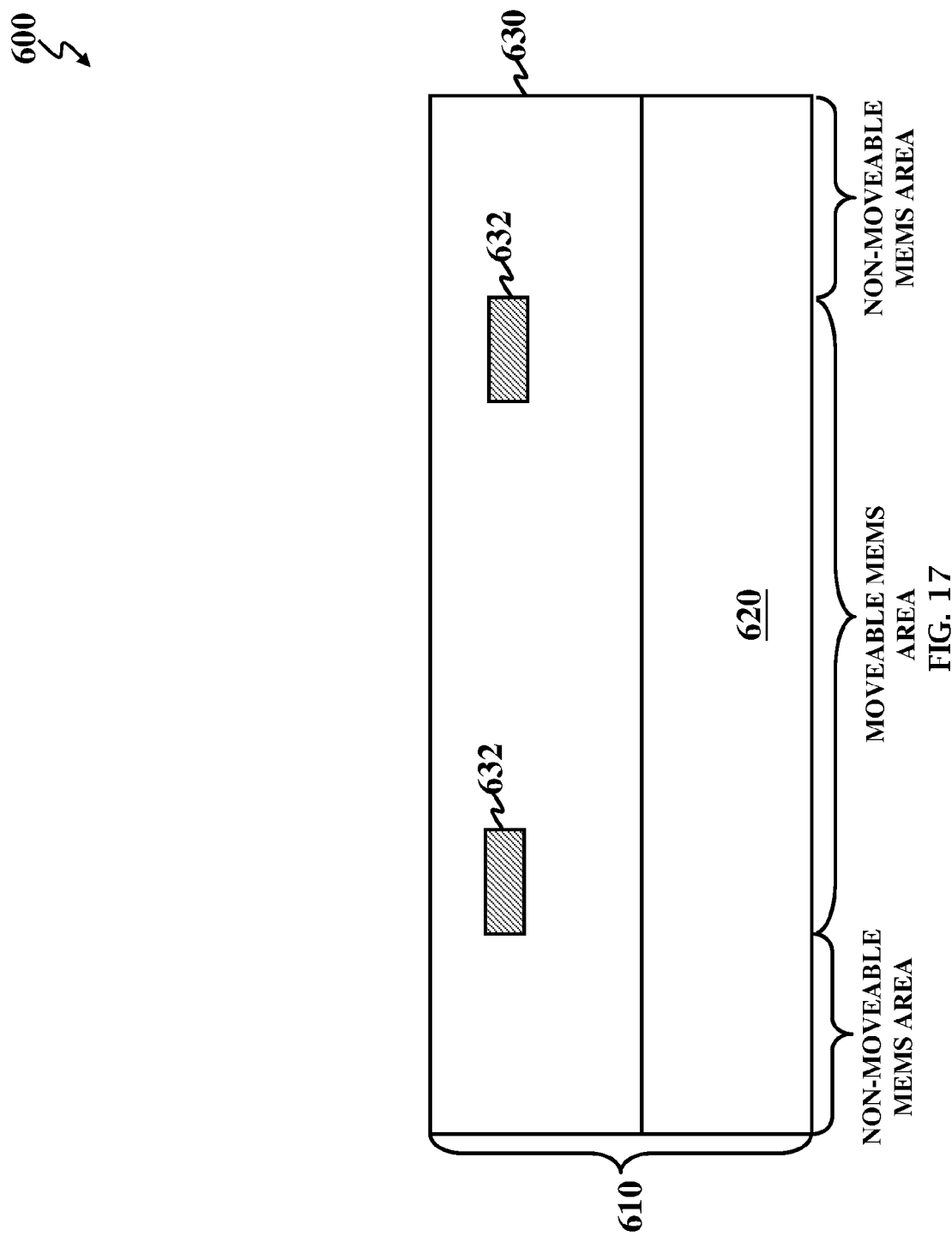
FIGS. 17-26 are diagrammatic cross-sectional views of a device during various stages of the method FIG. 16 according to various aspects of the present disclosure.

In FIG. 17, the device 600 includes a movable MEMS area, where movable features or portions of a MEMS device will be formed, and a non-movable MEMS area, where the movable features or portions of the MEMS device will not be formed. The device 600 further includes a substrate 610. In the depicted embodiment, the substrate 610 is a silicon-on-insulator (SOI) substrate. The SOI substrate can be fabricated using separation by implantation of oxygen (SIMOX), wafer bonding, other suitable methods, or a combination thereof. Alternatively or additionally, the substrate 610 is a semiconductor substrate including an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 610 includes a silicon layer 620 and an insulator layer 630. The silicon layer 620 may include various doped regions and other suitable features. In the depicted embodiment, the silicon layer 620 is a carrier wafer, and will be referred to as such in the following description. In the depicted embodiment, the insulator layer 630 includes conductive features 632. The conductive features 632 may include conductive materials, such as metal. Exemplary metals include aluminum, copper, aluminum alloy, copper alloy, aluminum/silicon/copper alloy, titanium, titanium nitride, tantalum, tantalum nitride, tungsten, polysilicon, metal silicide, other suitable metals, or combinations thereof. The conductive features 632 are disposed within the movable MEMS area, and as discussed further below, will be coupled with the MEMS device.

Figure 18:
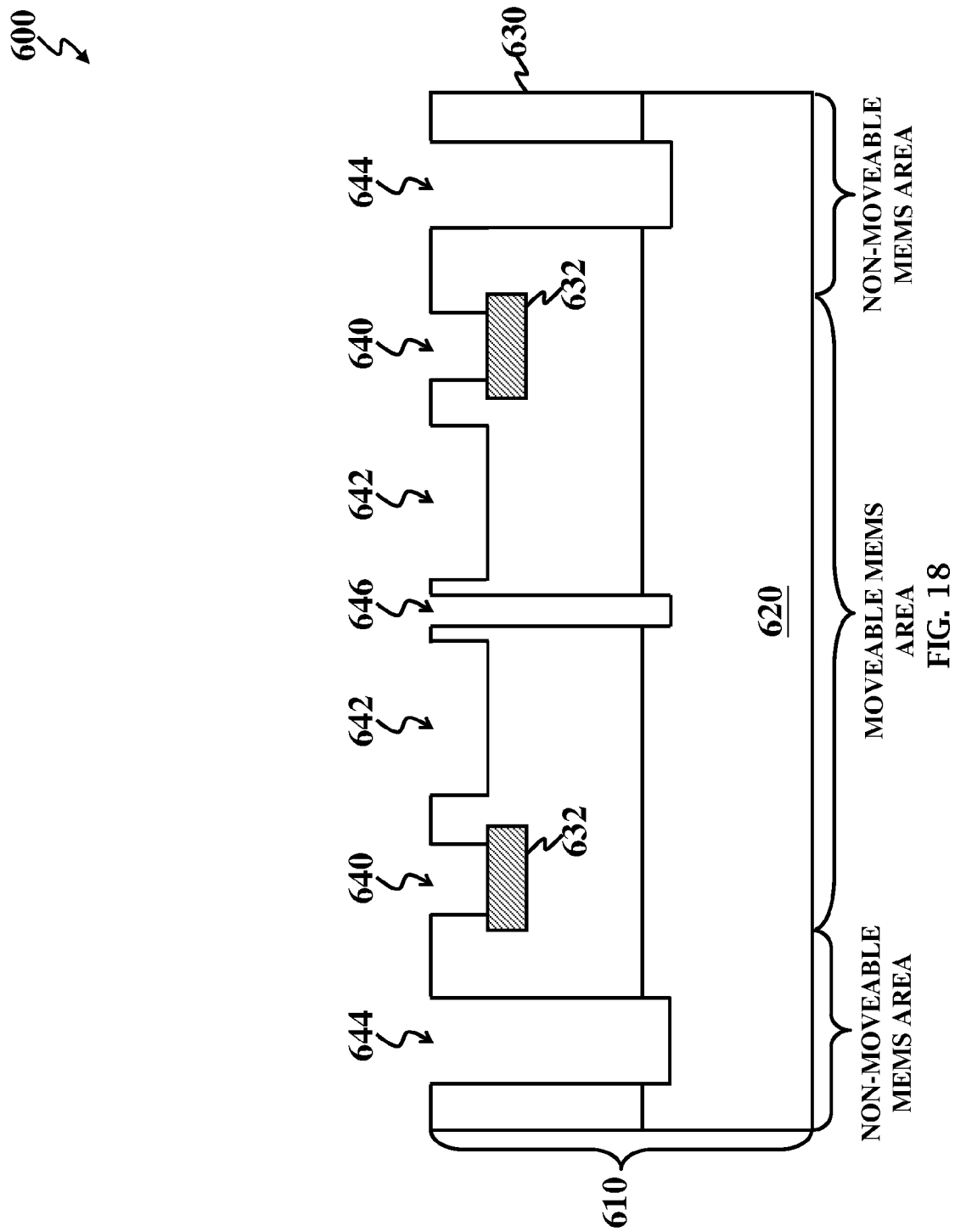

In FIG. 18, various trenches 640, 642, 644, and 646 are formed in the insulator layer 630 by a suitable process, such as an etching process. The trenches 640 are disposed in the movable MEMS area, extending into the insulator layer 630 from a top surface of the insulator layer 630. The trenches 640 expose the conductive features 632, and the trenches 640 define a portion of contact openings that will be used to form contacts to the conductive features 632. The trenches 642 are disposed in the movable MEMS area, extending a depth into the insulator layer 630 from the top surface of the insulator layer 630. The trenches 642 may be referred to as a cavity, which define an area where a portion of the MEMS device (such as the movable features of the MEMS device) may be formed. The trenches 644 are in the non-movable MEMS area, extending through the insulator layer 630 to a depth in the carrier wafer 620. The trenches 644 define a portion of a bypass structure of device 600. The trench 646 is in the movable MEMS area, extending through the insulator layer 630 to a depth in the carrier wafer 620. The trench 646 defines a portion of the bypass structure of the device 600.

Figure 19:
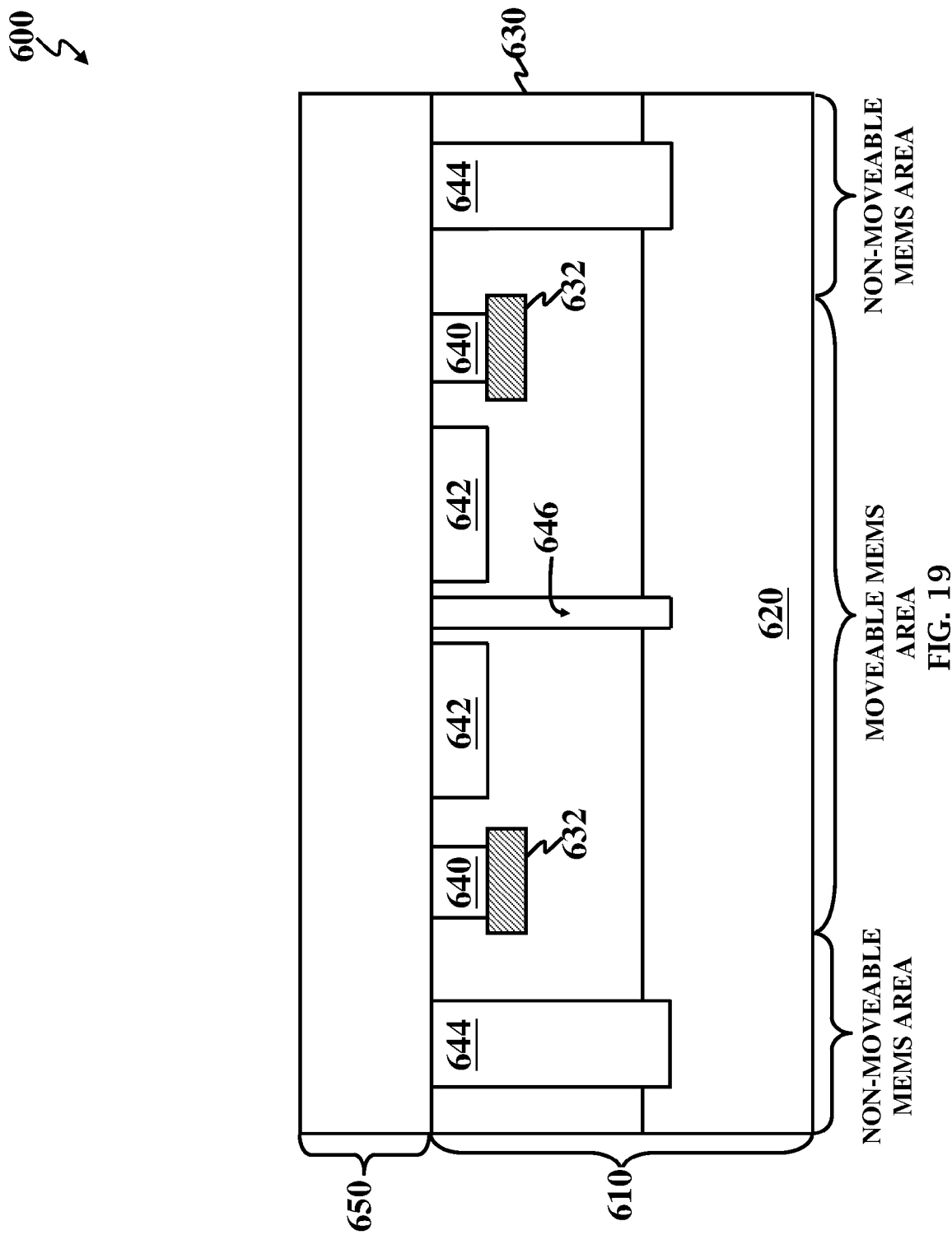

In FIG. 19, a substrate 650 is bonded to the substrate 610. In the depicted embodiment, the substrate 650 is a semiconductor substrate including silicon. Alternatively or additionally, the substrate 650 includes an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. As discussed further below, a MEMS device will be formed in the substrate 650, and thus, the substrate 650 may be referred to as a MEMS substrate (or wafer).

Figure 20:
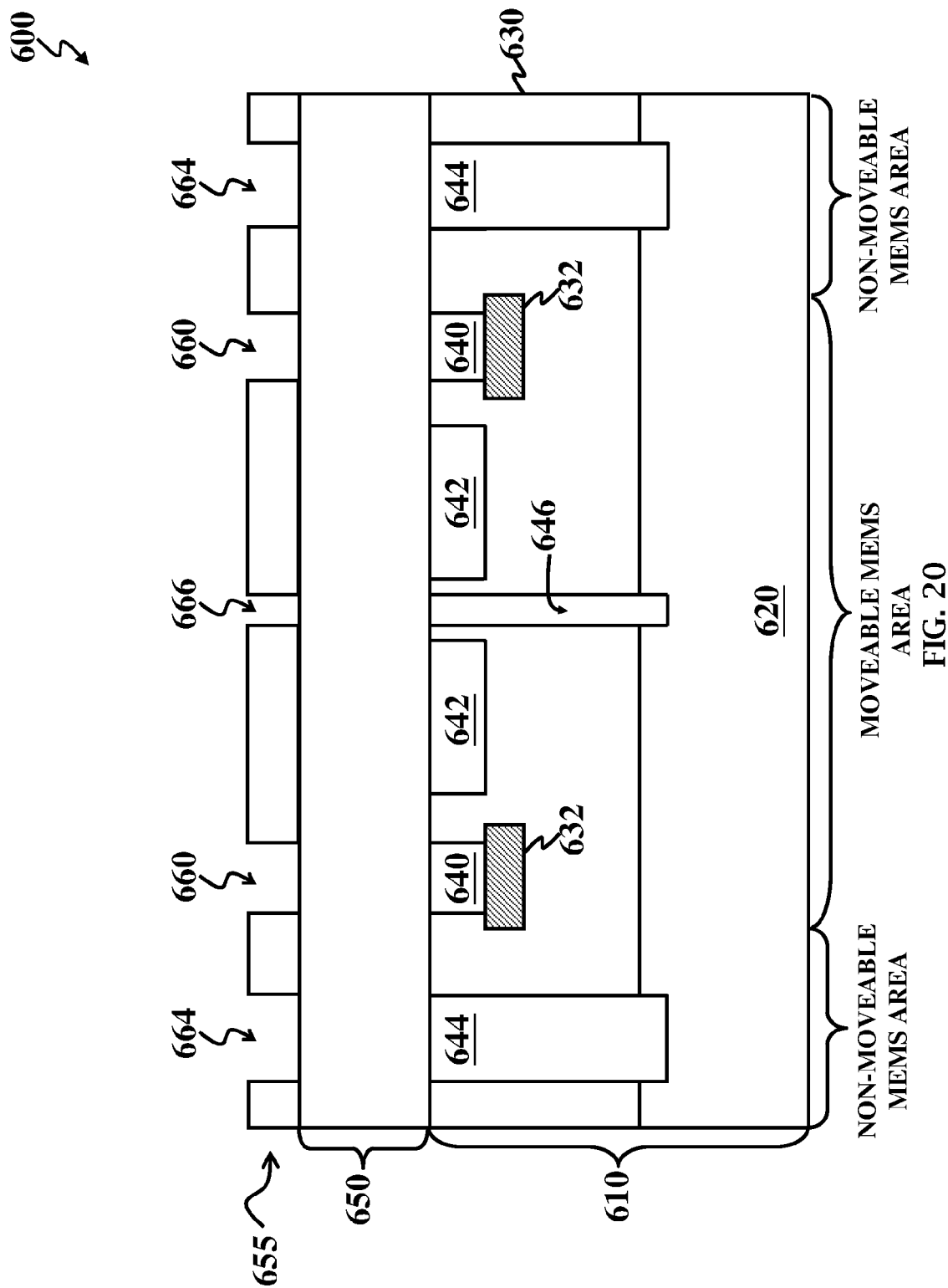

In FIG. 20, a patterned resist layer 655 is formed over the substrate 650. The patterned resist layer 655 includes openings 660, 664, and 666 that expose the substrate 650. The openings 660 are aligned with the trenches 640 in the substrate 610, the openings 664 are aligned with the trenches 644 in the substrate 610, and the opening 666 is aligned with the trench 646 in the substrate 610. The patterned resist layer 655 may be a positive or negative type resist material. The patterned resist layer 655 is formed by lithography patterning and/or etching processes. The lithography patterning processes may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

Figure 21:
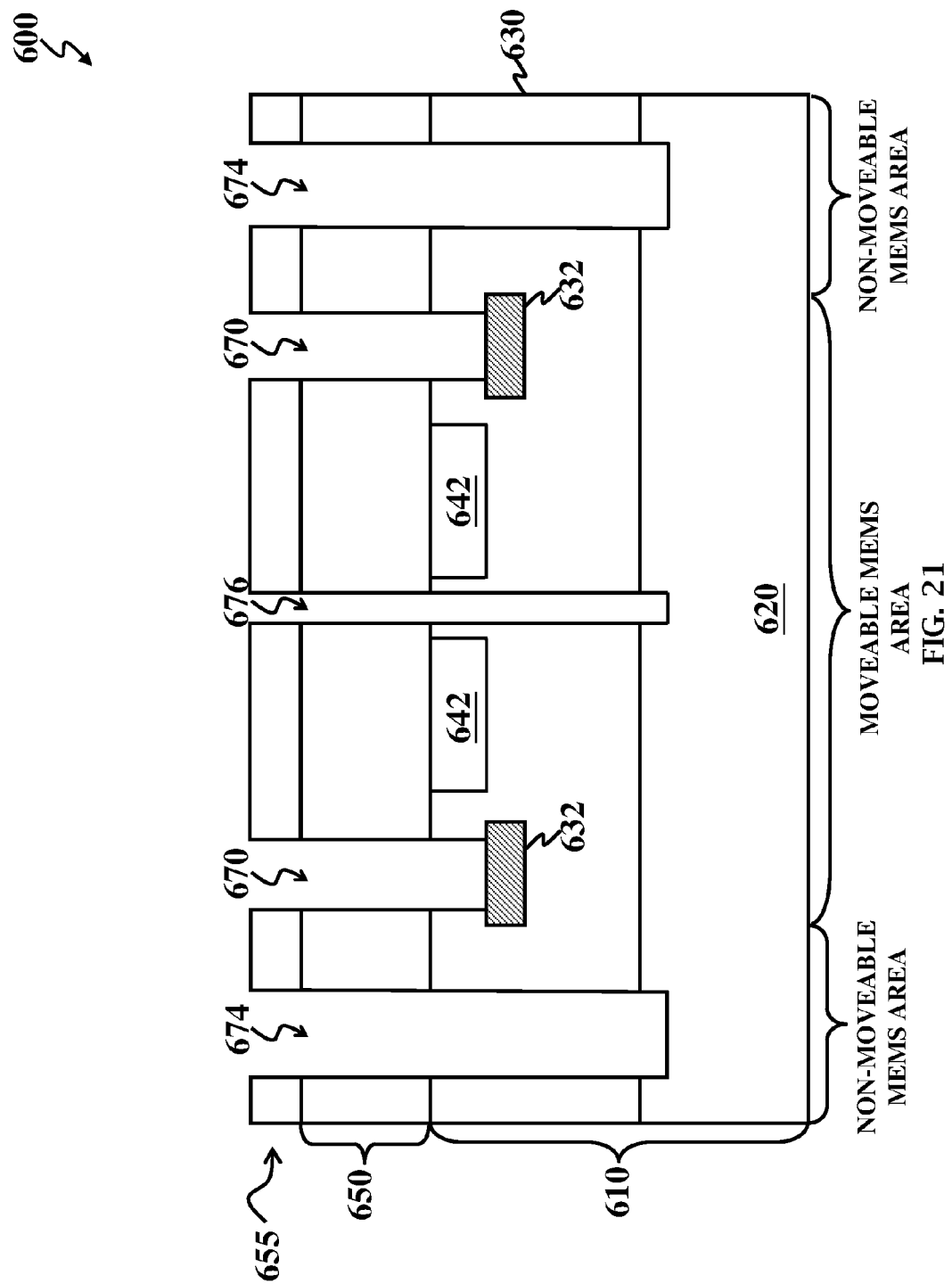

In FIG. 21, portions of the substrate 650 exposed by openings 660, 664, and 666 of the patterned resist layer 655 are removed, thereby forming trenches 670, 674, and 676. The portions of the exposed substrate 650 may be removed by an etching process, such as a dry etching process, a wet etching process, other suitable etching process, or combinations thereof. The trenches 670 are disposed in the movable MEMS area, extending through the substrate 650 and into the insulator layer 630 to a depth that exposes the conductive features 632. The trenches 670 define contact openings for contacts that will be formed to the conductive features 632. The trenches 674 are in the non-movable MEMS area, extending through the substrate 650 and the insulator layer 630 to a depth in the carrier wafer 620. The trenches 674 define a portion of the bypass structure from the substrate 650 to the substrate 610 (specifically to the carrier wafer 620) in the non-movable MEMS area. The trench 676 is in the movable MEMS area, extending through the substrate 650 and the insulator layer 630 to a depth in the carrier wafer 620. The trench 676 defines another portion of the bypass structure from the substrate 650 to the substrate 610 (specifically to the carrier wafer 620) in the movable MEMS area of the device 600.

Figure 22:
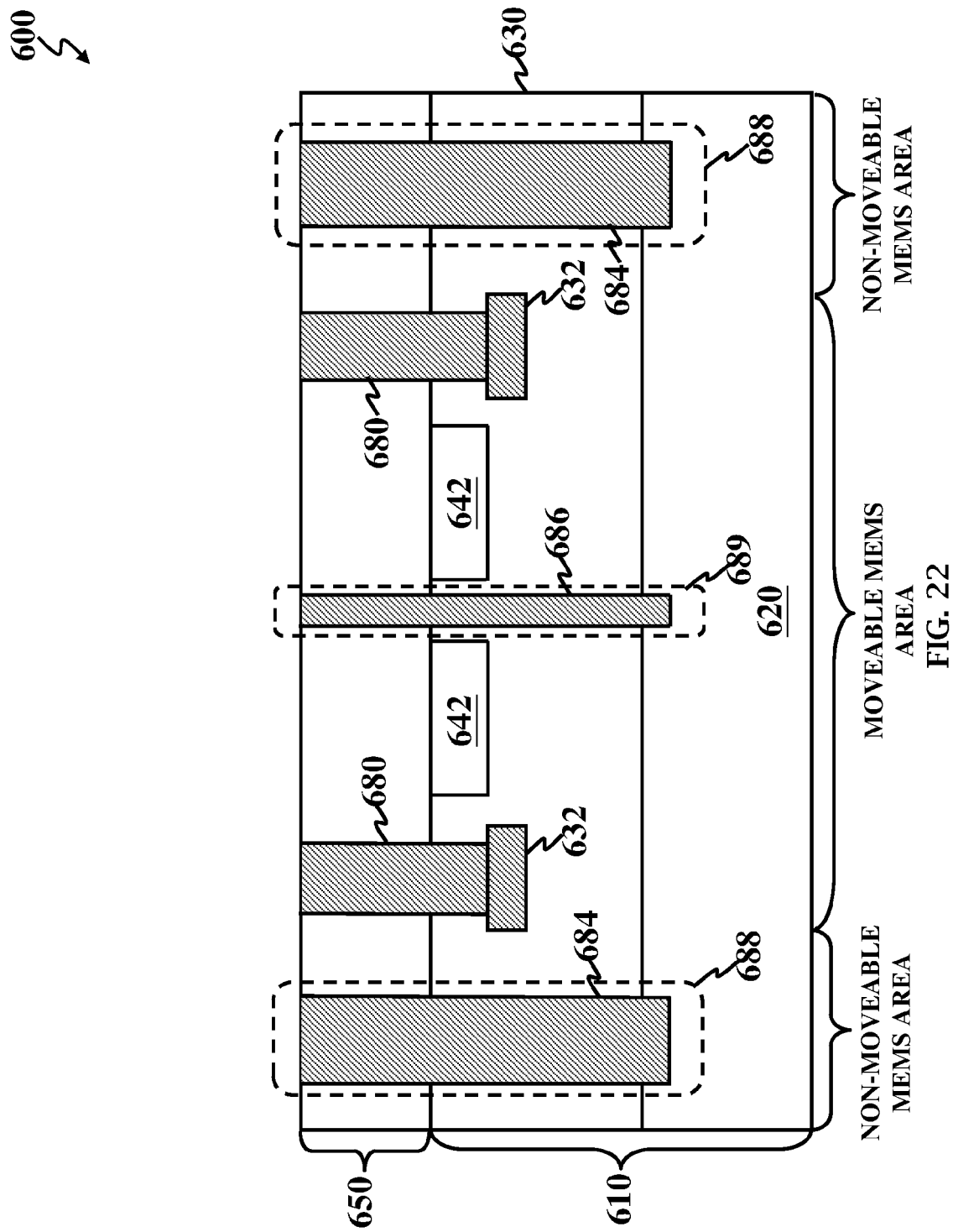

In FIG. 22, the patterned resist layer 655 is removed, and the trenches 670, 674, and 676 are filled with a conductive material, such as aluminum, copper, aluminum alloy, copper alloy, aluminum/silicon/copper alloy, titanium, titanium nitride, tantalum, tantalum nitride, tungsten, polysilicon, metal silicide, other suitable metals or alloys thereof, or combinations thereof. The filled trenches 670 form contacts 680. The contacts 680 provide coupling between the substrate 610 and the substrate 650. The filled trenches 674 and 676 form conductive paths 684 and 686, respectively. The conductive paths 684 extend through the device 600 from the substrate 650 to the carrier wafer 620 in the non-movable MEMS area, and the conductive path 686 extends through the device 600 from the substrate 650 to the carrier wafer 620 in the movable MEMS area. The conductive paths 684 and 686 are coupled with a portion of the carrier wafer 620, which is a grounded portion of the carrier wafer 620. The conductive paths 686 and 684 and respective grounded portions of the carrier wafer 620 form bypass structures 688 and 689 of the device 600. In an example, the grounded portion of the carrier wafer 620 is a doped region (not illustrated) disposed in the carrier wafer 620, such as that described above. As discussed further below, the bypass structures 688 and 689 help reduce a potential difference between the substrate 610 and the substrate 650, more specifically, between the carrier wafer 620 and the substrate 650. Such potential differences can arise during processing of the device 600, and particularly during plasma environment processing of the device 600.

In FIGS. 23-26, the substrate 650 is etched to form a device. In the depicted embodiment, the substrate 650 is etched (for example, by a plasma etching process) to form a MEMS device. The MEMS device is a MEMS device of a known type, such as a motion sensor (for example, a gyroscope or an accelerometer). Alternatively, the MEMS device could be a RF MEMS device (for example, an RF switch, resonator, or filter), an optical MEMS device (for example, a MEMS micro-mirror), a MEMS oscillator, a MEMS microphone, and/or any other MEMS type device, including future MEMS type devices. One of ordinary skill in the art will recognize that the MEMS device could alternatively include nanoelectromechanical elements, for example, the MEMS device could alternatively be a nanoelectromechanical systems (NEMS) device. The substrate 650 may also include microelectronic elements, such as those described above with reference to substrate 110. Where the substrate 650 includes various microelectronic elements, the MEMS device may be interconnected to the microelectronic elements.

Figure 23:
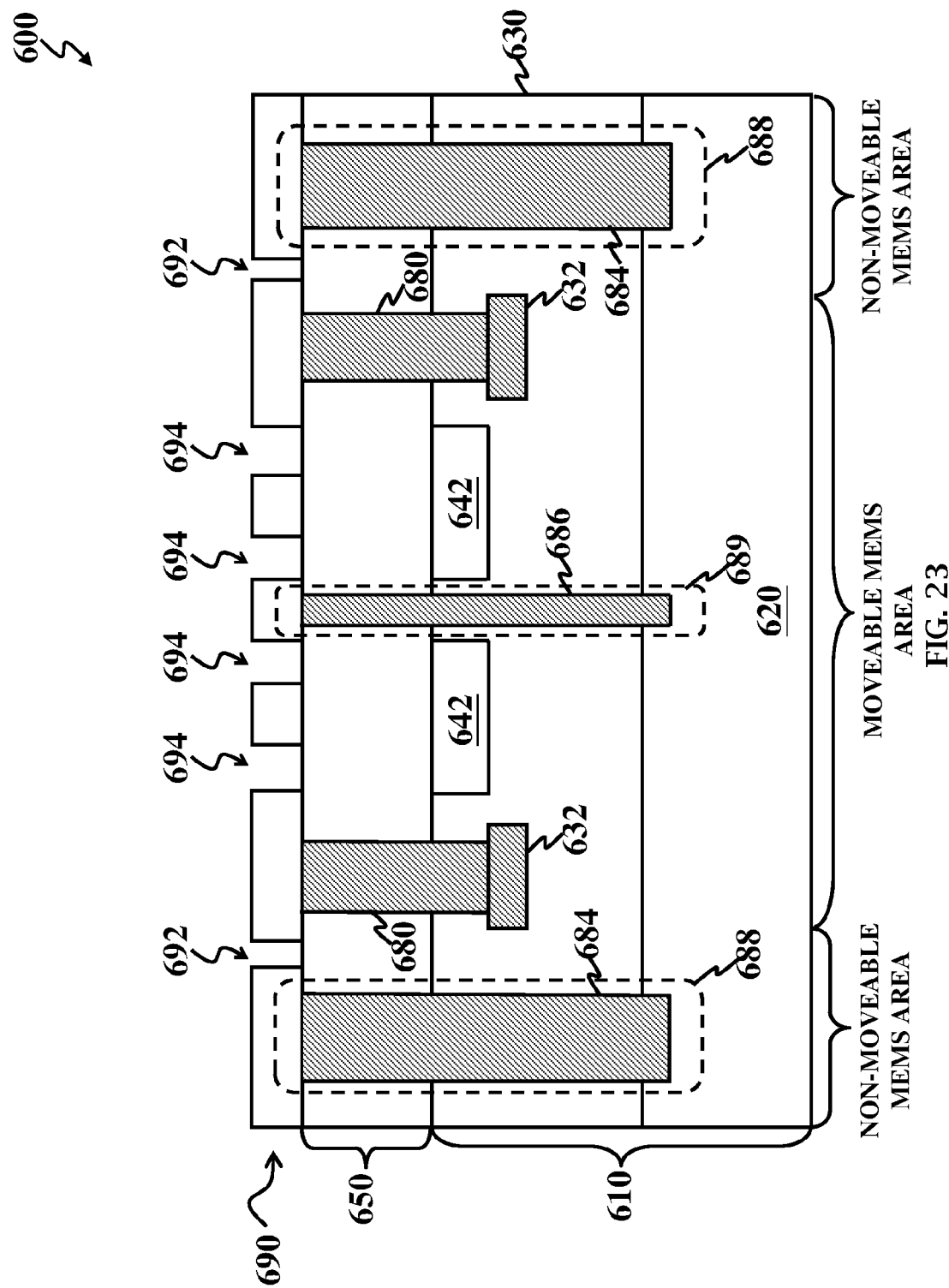

In FIG. 23, a patterned resist layer 690 is formed over the substrate 650. The patterned resist layer 690 includes openings 692 and 694 that expose the substrate 650. The patterned resist layer 690 may be a positive or negative type resist material. The patterned resist layer 690 is formed by lithography patterning and/or etching processes. The lithography patterning processes may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

Figure 24:
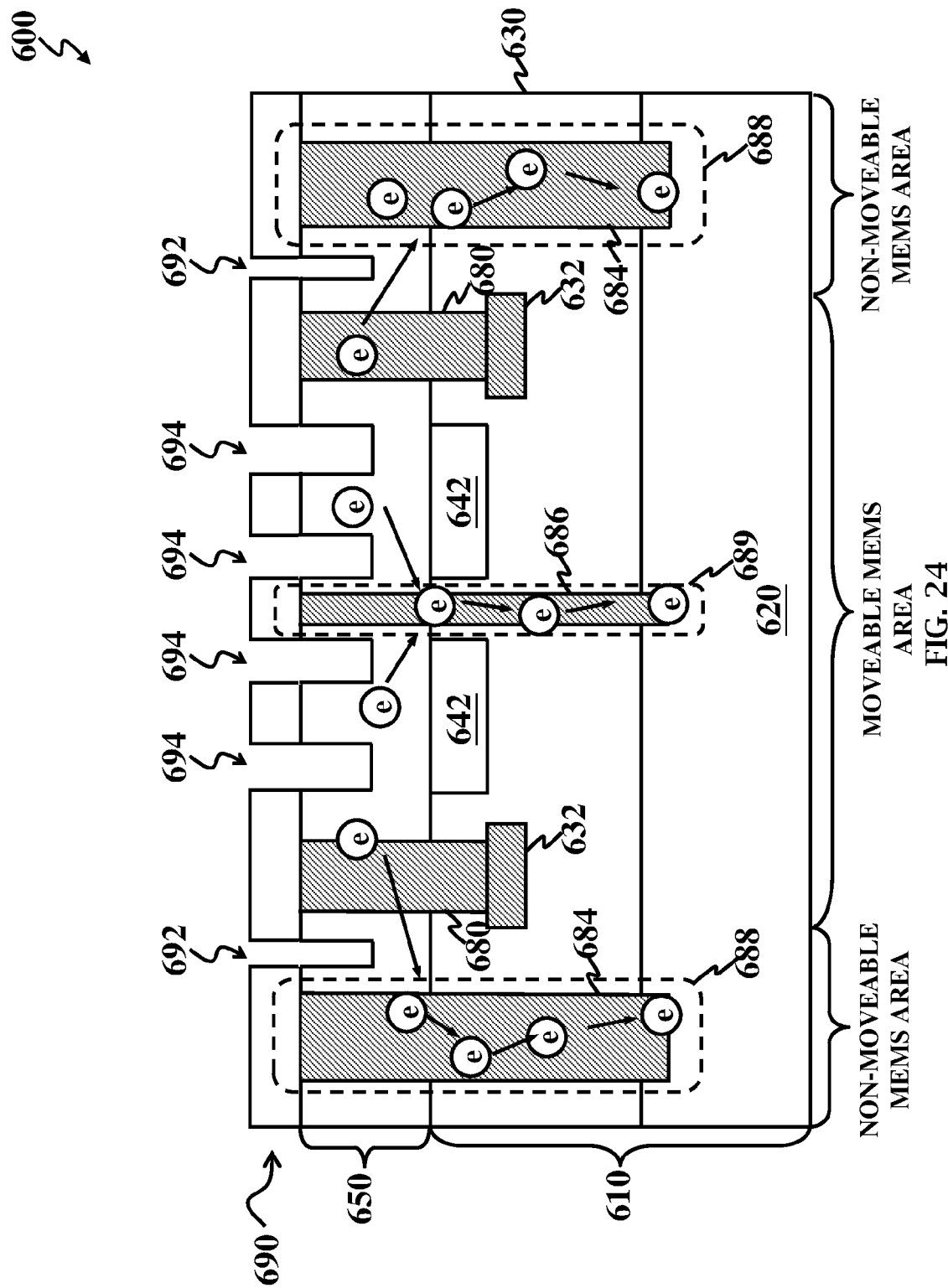
Figure 25:
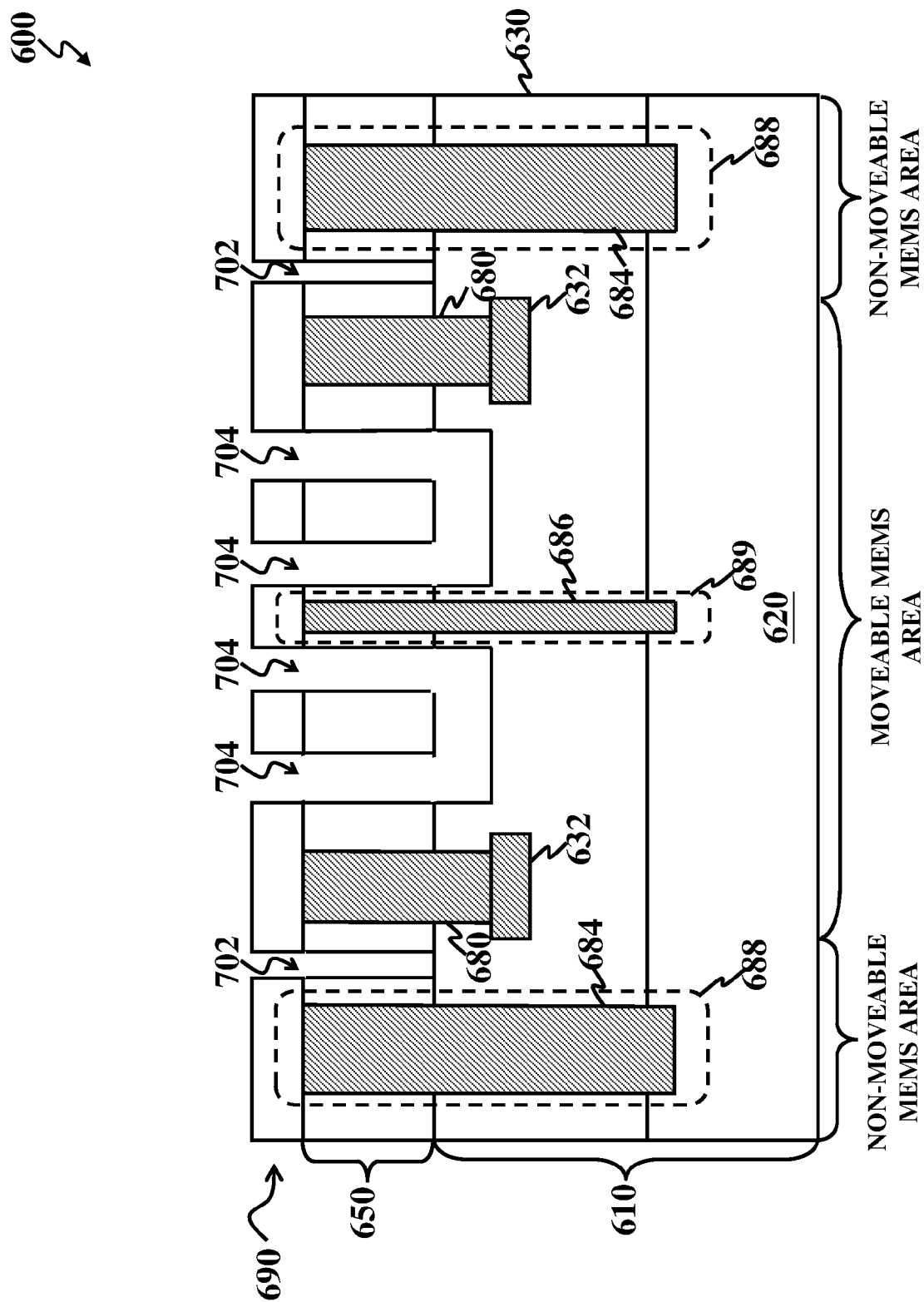
Figure 26:
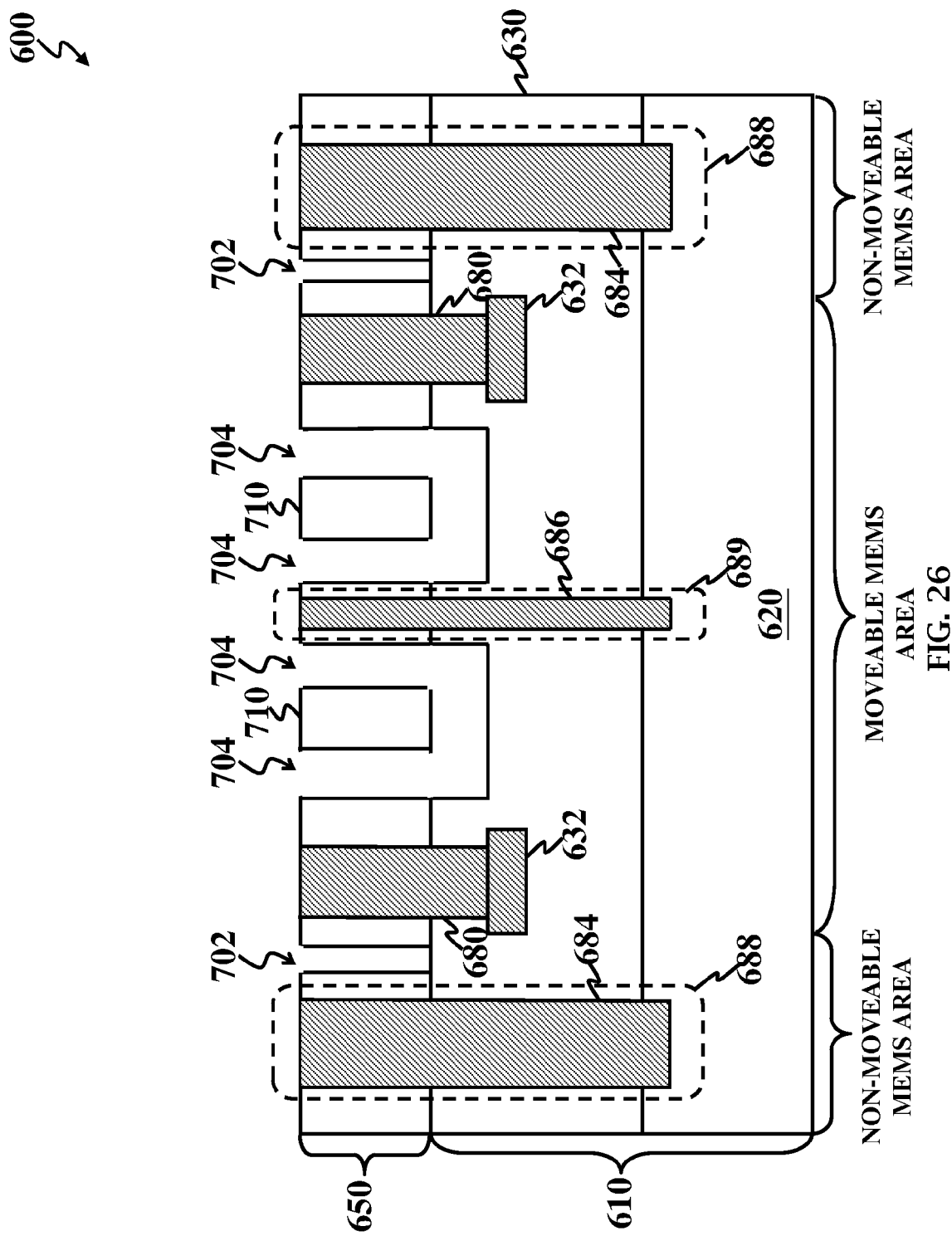

In FIGS. 24 and 25, portions of the substrate 650 exposed by openings 692 and 694 of the patterned resist layer 690 are removed, thereby forming trenches 702 and 704. The patterned resist layer 690 is thereafter removed as illustrated in FIG. 26. The portions of the exposed substrate 650 may be removed by an etching process, such as a dry etching process, a wet etching process, other suitable etching process, or combinations thereof. In the depicted embodiment, the exposed substrate 650 is removed by a plasma etching process. The trenches 702 extend through the substrate 650 to expose the top surface of the insulator layer 630. The trenches 702 isolate the bypass structures 688 from the movable MEMS area, and specifically, from the MEMS device. The trenches 704 are disposed in the movable MEMS area, extending through the substrate 650 to a depth in the insulator layer 630, specifically into the cavity (previously formed trenches 642) of the insulator layer 630. The remaining portions 710 of the substrate 650 within the movable MEMS area form portions of the MEMS device. For example, the remaining portions 710 of the substrate 650 may form movable portions of the MEMS device. The trenches 704 also isolate the bypass structure 689 from the MEMS device, particularly the movable portions of the MEMS device.

Typically, forming a MEMS device generates charge (electrons), which can cause damage to the MEMS device. For example, accumulated charge may create a potential difference between a substrate being processed to form the MEMS device (such as substrate 650 in the depicted embodiment) and a substrate bonded to the MEMS substrate ("a fixed substrate") (such as a carrier wafer 320 in the depicted embodiment). The potential difference can exert electrostatic force on movable portions of the MEMS device, causing the movable portions of the MEMS device to gravitate towards the fixed substrate. For example, a spring structure suspending the movable structure may contract to move the movable portions closer to the fixed substrate. If the potential difference is large enough, the movable portions of the MEMS device touch the fixed substrate, often sticking to the fixed substrate. This is often referred to as stiction, which can cause severe damage to the device.

In the depicted embodiment, bypass structures 688 and 689 protect the device 600 from damage that results in conventional devices during plasma environment processing, such as the plasma etching process used to form the MEMS device. The bypass structures 688 and 689 act as electrical bypass structures, such that etching-induced charge can be electrically discharged. For example, in FIG. 24, the bypass structures 688 and 689 include the conductive paths 684 and 686 and the grounded portions of the carrier wafer 620, respectively. As the substrate 650 is etched, the etching-induced charge (designated by electrons (e)) is discharged via the bypass structures 688 and 689 to the grounded portions of the carrier wafer 620. As noted above, the grounded portion of the carrier wafer 620 may be a doped region disposed in the carrier wafer 620. The bypass structures 688 and 689 minimize any charge-induced potential difference between the substrate 650 and the substrate 610. In the depicted embodiment, an interface between the conductive paths 684 and/or 686 forms an ohmic contact. The ohmic contact can reduce resistance, such that electrical charge can be discharged more efficiently and easily from the substrate 650 to the carrier wafer 620 via the conductive paths 684 and/or 686. The ohmic contact can thus ensure that charge is released even when small floating potential arises between the substrate 650 and carrier wafer 620. The bypass structures 688 and 689 can minimize etching damage, such as stiction issues, that arise in conventional processing. The bypass structures 688 and 689 are not limited to providing an electrical discharge path for charge generated during the etching process, such as charge generated during the plasma etching process. The bypass structures 688 and 689 also serve as electrical discharge paths for charge generated during any processing of the device 600, particularly, charge induced during any plasma environment processes.

Though the depicted embodiment illustrates bypass structures 688 in the non-movable MEMS area and bypass structure 689 in the movable MEMS area, the device 600 may include bypass structures 688 (or a single bypass structure 688) in the non-movable MEMS area, without the bypass structure 689 in the movable MEMS area, or include bypass structure 689 in the movable MEMS area, without the bypass structures 688 in the non-movable MEMS area. In an example, a single bypass structure 688 may be formed in the non-movable MEMS area. Further, in the depicted embodiment, the substrate 650 is bonded to the substrate 610 after trenches 642, 640, and 646 have been formed, which can be referred to as after a cavity is formed in the substrate 610. In alternative embodiments, the substrate 650 may be bonded to the substrate 610 illustrated in FIG. 17 before a cavity is formed in the substrate 610, with the contacts 680 and the bypass structures 689 and 690 being formed thereafter.

The present disclosure thus provides a bypass structure that can reduce plasma-induced damage during MEMS devices and/or CMOS-MEMS device processing. In the depicted embodiments, the MEMS devices and/or CMOS-MEMS devices include bypass structures that reduce plasma etching-induced damage. This should not be interpreted as limiting the disclosed bypass structures from reducing other types of plasma-induced damage. For example, it is contemplated that the disclosed bypass structures can reduce any damage that is induced by processes using a plasma environment.

The present disclosure also provides for many different embodiments of the bypass structures. Different embodiments may have different advantages, and no particular advantage, such as those described above, is necessarily required of any embodiment. For example, a method includes providing a first substrate including a CMOS device having a first voltage characteristic and a doped region having a second voltage characteristic that is different than the first voltage characteristic; forming a MLI structure over the first substrate, the MLI structure having a first portion coupled with the CMOS device and a second portion coupled with the doped region, wherein the second portion coupled with the doped region is isolated from the first portion coupled with the CMOS device; bonding a second substrate to the MLI structure; and etching the second substrate to form a MEMS device. In an example, the CMOS device has a breakdown voltage that is greater than a pass through voltage of the doped region.

Forming the MLI structure may include forming a plurality of conductive features in a dielectric layer, the plurality of conductive features extending from the CMOS device and the doped region to a top conductive layer of the MLI structure. Etching the second substrate to form the MEMS device may include plasma etching the second substrate. Etching the second substrate to form the MEMS device may include electrically discharging any charge induced by the etching via the second portion of the MLI structure coupled with the doped region.

The method may further include isolating the second portion of the MLI structure coupled with the doped region from the MEMS device. In an example, a portion of the second substrate is coupled with the second portion of the MLI structure coupled with the doped region; and the isolating the second portion of the MLI structure coupled with the doped region from the MEMS device includes etching the second substrate such that the portion of the second substrate coupled with the second portion of the MLI structure is isolated from the MEMS device. In another example, a portion of the second substrate is coupled with the second portion of the MLI structure coupled with the doped region; and the isolating the second portion of the MLI structure coupled with the doped region from the MEMS device includes isolating the portion of the second substrate coupled with the second portion of the MLI structure after packaging.

Bonding the second substrate to the MLI structure may include includes bonding the second substrate to the first portion of the MLI structure coupled with the CMOS device and to the second portion of the MLI structure coupled with the doped region. The method may further include forming a conductive layer over the MLI structure, wherein the conductive layer couples the first portion of the MLI structure coupled with the CMOS device with the second portion of the MLI structure coupled with the doped region. In an example, the first substrate further includes another CMOS device, a third portion of the MLI structure being coupled with the another CMOS device; and the forming the conductive layer over the MLI structure, wherein the conductive layer couples the first portion of the MLI structure coupled with the CMOS device with the second portion of the MLI structure coupled with the doped region may further include coupling the first portion of the MLI structure coupled with the CMOS device with the third portion of the MLI structure coupled with the another CMOS device.

In another example, a method includes providing a first substrate including CMOS devices; forming a MLI structure over the first substrate, the MLI structure having a first portion coupled with the CMOS devices and a second portion coupled with a portion of the first substrate, wherein the second portion of the MLI structure coupled with the portion of the first substrate is isolated from the first portion of the MLI structure coupled with the CMOS devices; forming a conductive layer over the MLI structure, wherein the conductive layer couples the first portion of the MLI structure coupled with the CMOS devices with the second portion of the MLI structure coupled with the portion of the first substrate; bonding a second substrate to the MLI structure; and etching the second substrate to form a MEMS device. The MLI structure may include top conductive layers, wherein each of the CMOS devices is coupled with a respective top conductive layer; and the forming the conductive layer over the MLI structure may include coupling each of the respective top conductive layers coupled with the CMOS devices to a top conductive layer of the second portion of the MLI structure coupled with the portion of the first substrate. The top conductive layer of the second portion of the MLI structure coupled with the portion of the first substrate may be a bonding pad.

The method may further include etching the conductive layer to re-isolate the second portion of the MLI structure coupled with the portion of the first substrate from the first portion of the MLI structure coupled with the CMOS devices. Forming the conductive layer over the MLI structure may include forming one of an Al layer, a TiN layer, a TiW layer, a Ti layer, and combination thereof. Etching the second substrate to form the MEMS device may include plasma etching the second substrate. The plasma etching the second substrate may include electrically discharging any charge induced by the etching via the conductive layer and the second portion of the MLI structure coupled with the portion of the first substrate.

In an example, an apparatus includes a first substrate including a CMOS device; a second substrate including a MEMS device; and an interconnect structure that electrically couples the CMOS device with the MEMS device, wherein the interconnect structure further includes a portion coupled with the first substrate and isolated from the MEMS device. The portion may couple the first substrate to the second substrate, and the portion may be coupled with a doped region of the first substrate. The apparatus may further include a conductive layer disposed over a top conductive layer of the portion of interconnect structure coupled with the first substrate. The top conductive layer may be a bonding pad.

In an example, an apparatus includes a first substrate; a second substrate that includes a MEMS device; an insulator disposed between the first substrate and the second substrate; and an electrical bypass structure disposed in the insulator layer that contacts a portion of the first substrate, wherein the electrical bypass structure is electrically isolated from the MEMS device in the second substrate and any device included in the first substrate. The electrical bypass structure is a conductive feature that extends through the insulator layer and contacts the portion of the first substrate. The conductive feature may extend through the second substrate. An interface between the conductive feature and the first substrate may form an ohmic contact, such that the electrical bypass structure is grounded through the ohmic contact. The first substrate may include a complementary metal-oxide-semiconductor (CMOS) device, and the conductive feature may be a portion of an interconnect structure disposed in the insulator layer, wherein the interconnect structure electrically couples the CMOS device to the MEMS device, and the conductive feature is electrically isolated from the CMOS device. The portion of the interconnect structure may contact a doped region of the first substrate. The conductive feature may includes a conductive layer disposed over a top conductive layer, such as a bonding pad, of the portion of interconnect structure. The electrical bypass structure may be disposed in a movable MEMS area of the first substrate and the second substrate, a non-movable MEMS area of the first substrate and the second substrate, or both.

In another example, an apparatus includes a first substrate including a complementary metal-oxide-semiconductor (CMOS) device; a second substrate including a microelectromechanical system (MEMS) device; and an interconnect structure that electrically couples the CMOS device with the MEMS device, wherein the interconnect structure includes a portion that contacts the first substrate and is electrically isolated from the CMOS device and the MEMS device. The portion contacts a doped region of the first substrate. The CMOS device has a breakdown voltage and the doped region has a pass-through voltage that is different than the breakdown voltage. A conductive layer may be disposed over a top conductive layer, such as a bonding pad, of the portion of interconnect structure coupled with the first substrate.

In yet another example, a method includes providing a first substrate and a second substrate; forming an electrical bypass structure in an insulator layer disposed between the first substrate and the second substrate, wherein the electrical bypass structure contacts the first substrate; and forming a MEMS device in the second substrate, wherein the forming the MEMS device includes performing a plasma-environment process and electrically discharging any charge induced by the plasma-environment process via the electrical bypass structure. The plasma-environment process may be a plasma etching that etches the second substrate. Forming the electrical bypass structure in the insulator layer may include forming a conductive feature from the second substrate to the first substrate. The conductive feature may interface with a grounded portion of the first substrate or a doped region of the first substrate. In an example, the first substrate includes a complementary metal-oxide-semiconductor (CMOS) device having a first voltage characteristic and a doped region having a second voltage characteristic that is different than the first voltage characteristic; and the forming the electrical bypass structure in the insulator layer includes forming an interconnect structure, the interconnect structure having a first portion that contacts the CMOS device and a second portion that contacts the doped region. The interconnect structure may be formed in the first substrate, the second substrate, or both the first and second substrates. Forming the electrical bypass structure may further include forming a conductive layer over the interconnect structure, wherein the conductive layer couples the first portion of the interconnect structure that contacts the CMOS device with the second portion of the interconnect structure that contacts the doped region. In an example, the method further includes after performing the plasma-environment process, disconnecting the first portion of the interconnect structure with the second portion of the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a first substrate that includes a complementary metal-oxide-semiconductor (CMOS) device;
   a second substrate that includes a microelectromechanical system (MEMS) device formed therein;
   an insulator disposed between the first substrate and the second substrate; and
   an electrical bypass structure extending through the second substrate and the insulator, the electrical bypass structure contacting a portion of the first substrate and a portion of the second substrate through which the electrical bypass structure extends;
   wherein the electrical bypass structure is electrically isolated from the MEMS device in the second substrate and any device included in the first substrate;
   wherein a recess in the second substrate electrically isolates the portion of the second substrate and electrical bypass structure from the MEMS device, the recess extending from a top surface to a bottom surface of the second substrate and residing adjacent to the portion of the second substrate; and
   wherein the electrical bypass structure comprises a plurality of conductive features extending through the second substrate and the insulator, one of the plurality of the conductive features being located between a plurality of movable portions of the MEMS device.

2. The apparatus of claim 1 wherein an interface between the one of the plurality of conductive features and the first substrate forms an ohmic contact.

3. The apparatus of claim 2 wherein the electrical bypass structure is grounded through the ohmic contact.

4. The apparatus of claim 1 wherein:
the electrical bypass structure electrically couples the CMOS device to the MEMS device; and
the one of the plurality of conductive features of the electrical bypass structure is electrically isolated from the CMOS device.

5. The apparatus of claim 4 wherein a portion of the electrical bypass structure contacts a doped region of the first substrate.

6. The apparatus of claim 4 wherein the one of the plurality of conductive features include a conductive layer disposed over a top conductive layer of a portion of the electrical bypass structure.

7. The apparatus of claim 6 wherein the top conductive layer is a bonding pad.

8. The apparatus of claim 1 wherein another one of the plurality of conductive features of the electrical bypass structure is disposed in a non-movable MEMS area of the first substrate and the second substrate.

9. An apparatus comprising:
a first substrate including a complementary metal-oxide-semiconductor (CMOS) device;
a second substrate including a microelectromechanical system (MEMS) device embedded therein; and
an interconnect structure that is electrically isolated from the CMOS device and the MEMS device, the interconnect structure extending at least from a top surface to a bottom surface of the second substrate;
wherein the interconnect structure includes a portion that contacts the first substrate and wherein the MEMS device is separated from a portion of the second substrate through which the interconnect structure extends by a recess in the second substrate, the recess extending from the top surface to the bottom surface of the second substrate and residing adjacent to the interconnect structure; and
wherein the interconnect structure comprises a plurality of conductive features extending at least from the top surface to the bottom surface of the second substrate, one of the plurality of the conductive features being located between a plurality of movable portions of the MEMS device.

10. The apparatus of claim 9 wherein the portion of the interconnect structure contacts a doped region of the first substrate.

11. The apparatus of claim 10 wherein the CMOS device has a breakdown voltage and the doped region has a pass-through voltage that is different than the breakdown voltage.

12. The apparatus of claim 9 further including a conductive layer disposed over a top conductive layer of the portion of interconnect structure coupled with the first substrate.

13. The apparatus of claim 12 wherein the top conductive layer is a bonding pad.

14. The apparatus of claim 6 wherein the conductive layer includes a recess to electrically isolate a portion of the electrical bypass structure that contacts the first substrate from a portion of the electrical bypass structure that contacts the second substrate.

15. The apparatus of claim 12 wherein the conductive layer includes a recess to electrically isolate the portion of the interconnect structure that contacts the first substrate from a portion of the interconnect structure that contacts the second substrate.

* * * * *